United States Patent
Silverman

(10) Patent No.: US 8,450,997 B2
(45) Date of Patent: May 28, 2013

(54) ELECTROMAGNETIC POSITION AND ORIENTATION SENSING SYSTEM

(75) Inventor: Kenneth J. Silverman, East Greenwich, RI (US)

(73) Assignee: Brown University, Providence, RI (US)

( * ) Notice: Subject to any disclaimer, the term of this patent is extended or adjusted under 35 U.S.C. 154(b) by 438 days.

(21) Appl. No.: 12/768,102

(22) Filed: Apr. 27, 2010

(65) Prior Publication Data

US 2010/0271012 A1   Oct. 28, 2010

Related U.S. Application Data

(60) Provisional application No. 61/173,315, filed on Apr. 28, 2009.

(51) Int. Cl.
   *G01B 7/14*   (2006.01)
   *G01B 7/30*   (2006.01)
   *H01F 5/00*   (2006.01)

(52) U.S. Cl.
   USPC ............... 324/207.15; 324/326; 324/207.23; 324/260; 324/336; 324/226; 324/207.22; 324/207.17; 324/262; 324/225; 342/448; 342/386; 342/422; 342/423; 342/445

(58) Field of Classification Search
   USPC ............ 324/326, 207.15, 207.23, 260, 336, 324/226, 207.22, 207.17, 262, 225; 342/448, 342/386, 422, 423, 445
   See application file for complete search history.

(56) References Cited

U.S. PATENT DOCUMENTS

| | | | |
|---|---|---|---|
| 799,550 A * | 9/1905 | Elliott | 227/1 |
| 3,088,109 A * | 4/1963 | Meyer | 342/99 |
| 3,329,954 A * | 7/1967 | Travers | 342/445 |
| 3,553,698 A * | 1/1971 | Keller | 342/424 |
| 4,054,881 A | 10/1977 | Raab | |
| 4,132,318 A | 1/1979 | Wang et al. | |
| 4,287,809 A | 9/1981 | Egli et al. | |
| 4,314,251 A | 2/1982 | Raab | |
| 4,394,831 A | 7/1983 | Egli et al. | |
| 4,736,640 A | 4/1988 | Hooks | |

(Continued)

OTHER PUBLICATIONS

Legget et al., "System for Quantitative Three-Dimensional Echocardiography of the Left Ventricle Based on a Magnetic-Field Position and Orientation Sensing System", IEEE Transactions on Biomedical Engineering, vol. 45, No. 4, Apr. 1998, pp. 494-504.*

(Continued)

*Primary Examiner* — Patrick Assouad
*Assistant Examiner* — Lamarr Brown
(74) *Attorney, Agent, or Firm* — Preti Flaherty Belibeau & Pachios LLP

(57) ABSTRACT

Magnetic tracking systems and methods for determining the position and orientation of a remote object. A magnetic tracking system includes a stationary transmitter for establishing a reference coordinate system, and at least one receiver. The remote object is attached to, mounted on, or otherwise coupled to the receiver. The transmitter can include a set of three mutually perpendicular coils having a common center point, or a set of three coplanar coils with separate centers. The receiver can include a set of three orthogonal coils. The position and orientation of the receiver and the remote object coupled thereto is determined by measuring the nine mutual inductances between the three transmitter coils and the three receiver coils. The magnetic tracking system provides reduced power consumption, increased efficiency, digital compensation for component variation, automatic self-calibration, automatic synchronization with no connections between transmitter and receiver, and rapid low-cost implementation.

4 Claims, 16 Drawing Sheets

U.S. PATENT DOCUMENTS

| | | | | |
|---|---|---|---|---|
| 4,737,794 | A * | 4/1988 | Jones | 342/448 |
| 5,197,846 | A | 3/1993 | Uno et al. | |
| 5,279,176 | A | 1/1994 | Tahmasebi et al. | |
| 5,301,566 | A | 4/1994 | Tahmasebi et al. | |
| 5,388,990 | A | 2/1995 | Beckman | |
| 5,453,686 | A | 9/1995 | Anderson | |
| 5,484,219 | A | 1/1996 | Drew et al. | |
| 5,583,513 | A * | 12/1996 | Cohen | 342/357.42 |
| 5,640,170 | A | 6/1997 | Anderson | |
| 5,645,077 | A | 7/1997 | Foxlin | |
| 5,752,513 | A | 5/1998 | Acker et al. | |
| 5,831,260 | A | 11/1998 | Hansen | |
| 5,889,505 | A | 3/1999 | Toyama et al. | |
| 5,901,936 | A | 5/1999 | Bieg | |
| 6,188,355 | B1 | 2/2001 | Gilboa et al. | |
| 6,288,785 | B1 | 9/2001 | Frantz et al. | |
| 6,501,276 | B1 * | 12/2002 | Bosnar | 324/334 |
| 7,354,398 | B2 * | 4/2008 | Kanazawa | 600/109 |
| 7,375,529 | B2 * | 5/2008 | Dupuis et al. | 324/331 |
| 7,868,628 | B2 * | 1/2011 | Shimazawa | 324/655 |
| 8,018,382 | B2 * | 9/2011 | Shore et al. | 342/386 |
| 8,258,782 | B2 * | 9/2012 | Kaita et al. | 324/207.25 |
| 2001/0017542 | A1 * | 8/2001 | Kawasaki et al. | 324/251 |
| 2004/0046558 | A1 * | 3/2004 | Matsumoto | 324/326 |
| 2004/0070399 | A1 * | 4/2004 | Olsson et al. | 324/326 |
| 2004/0090226 | A1 * | 5/2004 | Khalfin | 324/207.17 |
| 2005/0052178 | A1 * | 3/2005 | Ries | 324/207.23 |
| 2005/0062469 | A1 | 3/2005 | Anderson | |
| 2005/0064815 | A1 * | 3/2005 | Kanazawa | 455/41.1 |
| 2005/0104776 | A1 | 5/2005 | Anderson | |
| 2005/0128125 | A1 * | 6/2005 | Li et al. | 342/22 |
| 2006/0255795 | A1 * | 11/2006 | Higgins et al. | 324/207.17 |
| 2008/0036652 | A1 * | 2/2008 | Shore et al. | 342/357.06 |
| 2008/0120061 | A1 | 5/2008 | Higgins et al. | |
| 2008/0238429 | A1 * | 10/2008 | Safinya et al. | 324/348 |
| 2008/0297158 | A1 * | 12/2008 | Heger et al. | 324/326 |
| 2008/0309344 | A1 * | 12/2008 | Larsen | 324/326 |
| 2009/0096443 | A1 * | 4/2009 | Anderson | 324/207.17 |
| 2009/0115406 | A1 * | 5/2009 | Anderson et al. | 324/207.17 |
| 2009/0128139 | A1 * | 5/2009 | Drenth et al. | 324/207.22 |
| 2009/0171190 | A1 * | 7/2009 | Uchiyama et al. | 600/424 |
| 2009/0219027 | A1 * | 9/2009 | Morrison et al. | 324/326 |
| 2009/0224978 | A1 * | 9/2009 | Shirakawa | 342/386 |
| 2009/0295376 | A1 * | 12/2009 | Vu et al. | 324/207.23 |
| 2010/0026282 | A1 * | 2/2010 | Kaita et al. | 324/207.25 |
| 2010/0201352 | A1 * | 8/2010 | Englert | 324/207.22 |
| 2012/0313630 | A1 * | 12/2012 | Goetz | 324/207.22 |

OTHER PUBLICATIONS

Paperno et al., "A New Method for Magnetic Position and Orientation Tracking", IEEE Transactions on Magnetics, vol. 37, No. 4, Jul. 2001, pp. 1938-1940.*

Raab, "Quasi-Static Magnetic-Field Technique for Determining Position and Orientation", IEEE Transactions on Geoscience and Remote Sensing, vol. GE-19, No. 4, Oct. 1981, pp. 235-243.*

Liberty Electromagnetic Motion Tracking System, Polhemus Innovation in Motion™, pp. 1-3, Copyright © Polhemus, www.polhemus.com.

Nordic Semiconductor—News, Dec. 8, 2008, pp. 1-7, www.nordicsemi.com.

* cited by examiner

ELECTROMAGNETIC POSITION AND ORIENTATION SENSING SYSTEM

CROSS REFERENCE TO RELATED APPLICATIONS

This application claims benefit of U.S. Provisional Patent Application No. 61/173,315 filed Apr. 28, 2009, entitled ELECTROMAGNETIC POSITION AND ORIENTATION SENSING SYSTEM.

STATEMENT REGARDING FEDERALLY SPONSORED RESEARCH OR DEVELOPMENT

Not applicable

BACKGROUND OF THE INVENTION

The present application relates to an improved system and method of determining the position and orientation of a remote object.

A typical system for determining the position and orientation of a remote object includes a receiver with three receiver coils that are orthogonal to one another, and a transmitter with three transmitter coils that carry sinusoidal currents operative to generate electromagnetic fields defining a reference coordinate system. The receiver, which is associated with the remote object, is operative to measure the voltage induced in each receiver coil by the electromagnetic fields. There are nine such induced voltages, and the output of each receiver coil is the sum of three of these voltages. The measured values of the induced voltages are employed to determine the position and orientation of the remote object relative to the reference coordinates defined by the electromagnetic fields.

The design of such a conventional system for determining the position and orientation of a remote object poses a number of challenges, including at least the following:

1. separating the three signals received at each receiver coil to determine their three individual amplitudes;
2. doing that separation without any connection from the transmitter clock source to the receiver, as such, a connection is undesirable for reasons of cost and connectivity;
3. generating the transmitter electromagnetic fields at acceptable cost, and tolerant to variations in component values from manufacturing tolerance, aging, and temperature change;
4. providing a mechanism by which any receiver may be used with any transmitter without prior calibration by determining channel calibration from ordinary measurement data; and
5. compacting the transmitter coils for some applications so that they are coplanar yet can still generate electromagnetic fields that define a two or three-dimensional coordinate system.

It would be desirable to have improved systems and methods of determining the position and orientation of a remote object that provide solutions to these challenges.

BRIEF SUMMARY OF THE INVENTION

In accordance with the present application, improved systems and methods of determining the position and orientation of a remote object are disclosed. In accordance with the presently disclosed systems and methods, a magnetic tracking system for determining the position and orientation of a remote object includes a stationary transmitter for establishing a reference coordinate system, and at least one receiver. The remote object may be attached to, mounted on, or otherwise coupled to the receiver. In one embodiment, the transmitter includes a set of three mutually perpendicular coils having a common center point, and the receiver includes a similar set of three orthogonal coils. The position and orientation of the receiver and the remote object coupled thereto can be determined by measuring the nine mutual inductances between the three transmitter coils and the three receiver coils.

In one embodiment, the transmitter included in the presently disclosed magnetic tracking system employs switching techniques in conjunction with a plurality of parallel resonant circuits for reducing the current and overall power of the transmitter. In accordance with this embodiment, the transmitter includes a plurality of resonant circuits, a plurality of digitally controllable switches, and a plurality of pulse generators. Each resonant circuit has a transmitter coil, and a resonating capacitor electrically coupled in parallel with the transmitter coil. Each digitally controllable switch is electrically coupled in series between one end of a corresponding resonant circuit and one terminal of a power source. Each of the other ends of the resonant circuits is electrically coupled to the other terminal of the power source. Each pulse generator generates periodic digital pulses for controlling one of the digitally controllable switches, thereby energizing the respective resonant circuits with a conduction angle substantially within a range of 5 to 15 degrees. The resonant circuits respond to this excitation by generating sustained, continuous, periodic, and substantially sinusoidal currents in the resonant circuits. In response to the respective continuous, periodic, and substantially sinusoidal currents, the transmitter coils generate electromagnetic fields defining the reference coordinate system for the magnetic tracking system.

In another embodiment, the transmitter included in the presently disclosed magnetic tracking system employs a digital tuning technique that compensates for component variation so that precision component values are not required to achieve resonance. In accordance with this embodiment, the transmitter includes a plurality of resonant circuits, first and second sets of digitally controllable switches, first and second sets of pulse generators, sense circuitry, and a controller. Each resonant circuit has a transmitter coil, a resonating capacitor electrically coupled in parallel with the transmitter coil, and a tuning capacitor connected by a corresponding second digitally controllable switch in parallel with the resonating capacitor. Each of the first set of digitally controllable switches is electrically coupled in series between one end of one of the resonant circuits and one terminal of a power source. Each of the other ends of the resonant circuits is electrically coupled to the other terminal of the power source. Each of the first set of pulse generators generates periodic digital pulses for controlling one of the first set of digitally controllable switches, thereby sustaining continuous, periodic, and substantially sinusoidal currents in the resonant circuits. In response to the respective continuous, periodic, and substantially sinusoidal currents, the transmitter coils generate electromagnetic fields defining a reference coordinate system for the magnetic tracking system. Each of the second set of digitally controllable switches is electrically coupled in series between one end of one of the tuning capacitors and the other terminal of the power source. The other end of each tuning capacitor is attached to its corresponding resonant circuit at the same end as the first digitally controllable switch. Each of the second set of pulse generators generates digital pulses for controlling one of the second set of digitally controllable switches, thereby switchably coupling the respective tuning capacitors in parallel with the respective resonating capacitors. The sense circuitry measures the currents sustained in the resonant circuits, and the controller controls the timing of the digital pulses generated by the second set of pulse generators based on the current measurements of the sense circuitry, thereby controlling operation of the second set of digitally controllable switches for reducing the power consumption of the resonant circuits. Tuning for minimum power also compensates for changes in transmitter operating frequency should that be necessary to avoid interference between independent transmitters operating near each other.

In a further embodiment, the transmitter included in the presently disclosed magnetic tracking system employs bifilar or trifilar coil windings to reduce the required voltage of the power source. In accordance with this embodiment, the transmitter includes a plurality of resonant circuits, a plurality of digitally controllable switches, and a plurality of pulse generators. Each resonant circuit has an autotransformer coil including a bifilar or trifilar winding with a tap, and a resonating capacitor electrically coupled in parallel with the autotransformer coil. Each digitally controllable switch is electrically coupled in series between the tap of one of the autotransformer coil windings and one terminal of the power source. Each resonant circuit has one end electrically coupled to the other terminal of the power source. Each pulse generator generates periodic digital pulses for controlling one of the digitally controllable switches, thereby sustaining continuous, periodic, and substantially sinusoidal currents in the plurality of resonant circuits. In response to the respective continuous, periodic, and substantially sinusoidal currents, the transmitter coils generate electromagnetic fields defining a reference coordinate system for the magnetic tracking system.

In further accordance with this embodiment, the three bifilar or trifilar coil windings are packaged in a compact coil assembly including first and second substrates, and a plurality of spacing members. Each of the first and second substrates has an outer face, and the first and second substrates are spaced apart and generally parallel to each other. The spacing members are mounted between the first and second substrates, defining a spacing between the substrates. The first and second substrates and the plurality of spacers form a frame, and the first, second, and third coils are disposed around the frame such that each of the coils is generally orthogonal with respect to the other two coils.

In still another embodiment, the presently disclosed magnetic tracking system employing continuous, periodic, and substantially sinusoidal currents implements techniques for obtaining the signs of the position and orientation measurements. In accordance with this embodiment, the magnetic tracking system detects, within a sampling window, a plurality of receiver voltages induced in each receiver coil, and calculates a time shift between a common zero crossing of the receiver voltages and the start of the sampling window. The system converts each receiver voltage induced in each receiver coil into a set of digital samples, and, for each set of digital samples, calculates an inner product of the set of digital samples and a predetermined set of basis functions, thereby obtaining sine and cosine component amplitudes for each receiver voltage at each receiver coil. Using the sine and cosine component amplitudes for each receiver voltage and taking into account the time shift, the system calculates a real phasor component for each receiver voltage induced in each receiver coil. Each real phasor component has an amplitude and a sign at least partially indicative of the position and the orientation, respectively, of a remote object coupled to the receiver within the reference coordinate system established by the transmitter coils.

In a further embodiment, the presently disclosed magnetic tracking system implements techniques for automatic distance calibration by an end user. In accordance with this embodiment, the user successively positions the receiver at a plurality of random, widely distributed test locations within a 3-dimensional space. The electromagnetic fields generated by the transmitter coils produce corresponding pluralities of magnetic fields at the test locations. The magnetic fields at each test location are represented by three magnetic field vectors, which define an ellipsoid having an associated aspect ratio. The system detects, within a sampling window, the receiver voltages induced in each receiver coil at each test location, and obtains sine and cosine component amplitudes for each receiver voltage at each receiver coil. Using the sine and cosine component amplitudes for each receiver voltage, the system calculates a real phasor component and an imaginary phasor component for each receiver voltage induced in each receiver coil. Using the real and imaginary phasor components for the receiver voltages detected at each test location, the system iteratively adjusts the phase associated with each of the real and imaginary phasor components for each receiver voltage to minimize the imaginary phasor component, applies a calibration scale value to each real phasor component for each receiver voltage, and iteratively adjusts the calibration scale value applied to each real phasor component for each receiver voltage. In this way, the magnetic tracking system is calibrated so as to adjust the aspect ratio of the ellipsoids defined by the three magnetic field vectors at the respective test locations to at least approximately 2:1:1.

In yet another embodiment, the presently disclosed magnetic tracking system is configured so that the transmitter can fit inside a thin flat box, thereby facilitating embedding the transmitter box into the user's environment, and increasing the likelihood that the transmitter box would be viewed by the user as a feature of, rather than an obstacle in, that environment. In accordance with this embodiment, the magnetic tracking system includes a coil assembly having a generally flat transmitter housing with a top surface generally defining a top surface plane, and a plurality of transmitter coils fixedly positioned within the transmitter housing. Each of the transmitter coils has a center and coil turns that generally lie in a plane substantially parallel to the top surface plane. In addition, the center of each transmitter coil is displaced from the centers of the other transmitter coils.

Other features, functions, and aspects of the invention will be evident from the Drawings and/or the Detailed Description of the Invention that follow.

BRIEF DESCRIPTION OF THE SEVERAL
VIEWS OF THE DRAWINGS

The invention will be more fully understood with reference to the following Detailed Description of the Invention in conjunction with the drawings of which:

DETAILED DESCRIPTION OF THE INVENTION

The disclosure of U.S. Provisional Patent Application No. 61/173,315 filed Apr. 28, 2009, entitled ELECTROMAGNETIC POSITION AND ORIENTATION SENSING SYSTEM is incorporated herein by reference in its entirety.

An improved system and method of determining the position and orientation of a remote object is disclosed that avoids the drawbacks of conventional remote object position and orientation determining techniques.

Figure 1:
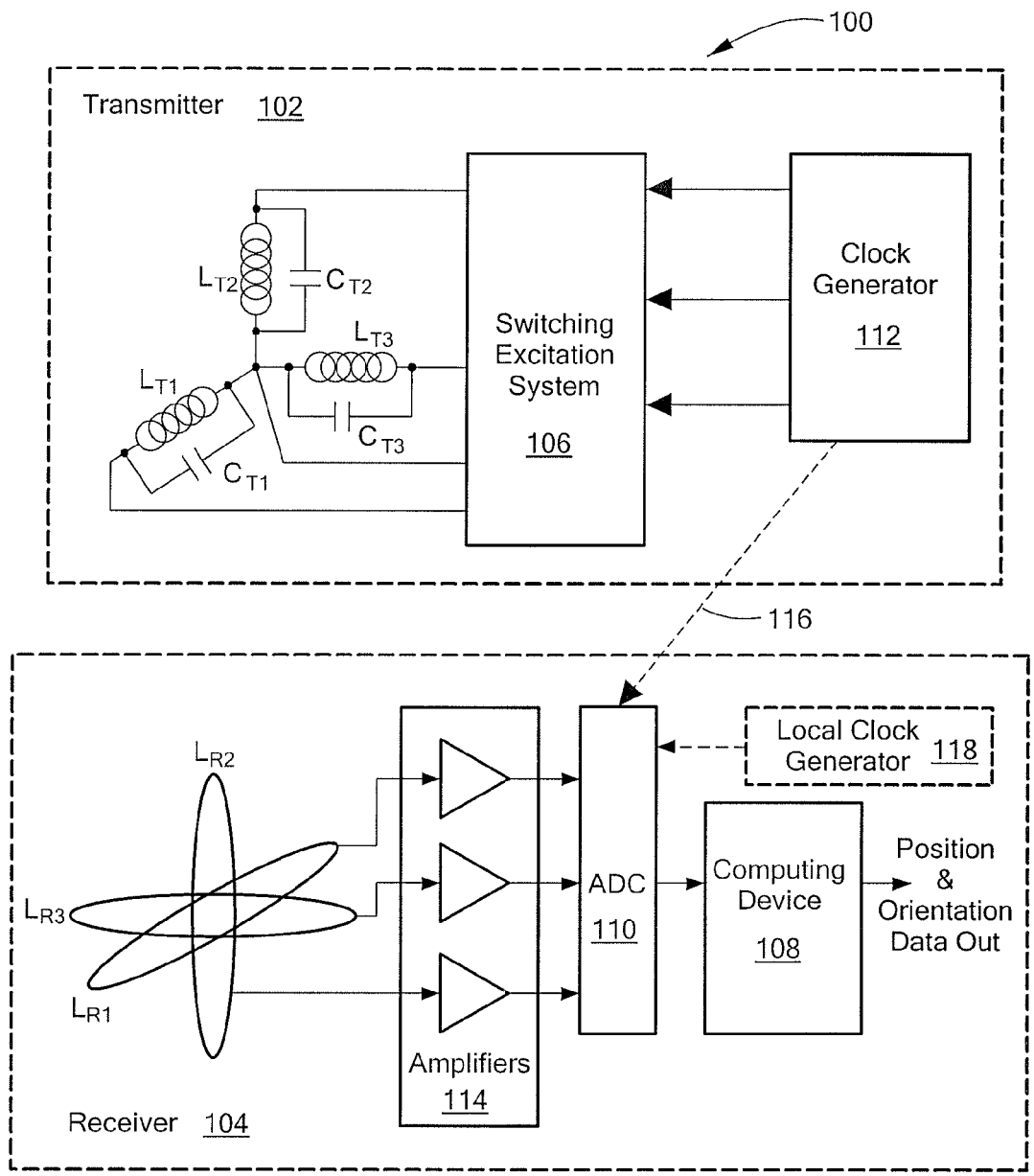
FIG. 1 is a schematic diagram of a system for determining the position and orientation of a remote object by measuring the mutual inductance coupling between multiple receiver coils associated with the object and multiple transmitter coils generating reference electromagnetic fields, according to an exemplary embodiment of the present application.

FIG. 1 depicts an illustrative system 100 for measuring the position and orientation of a remote object. As shown in FIG. 1, the system 100 includes a stationary transmitter 102 and a receiver 104. The remote object (not shown) is associated with the receiver 104. For example, the remote object may be attached to, mounted on, or otherwise coupled to the receiver 104. The stationary transmitter 102 is operative to establish a reference coordinate system. In one embodiment, the transmitter 102 includes a set of three mutually perpendicular coils LT1, LT2, LT3 having a common center point, and the receiver 104 includes a similar set of orthogonal coils LR1, LR2, LR3. The position and orientation of the receiver 104 and thus the remote object can be determined by measuring the nine mutual inductances between the three transmitter coils LT1, LT2, LT3 and the three receiver coils LR1, LR2, LR3. It is noted that the electromagnetic fields generated by the transmitter coils LT1, LT2, LT3 are typically assumed to have the functional form of an oscillating magnetic dipole.

Mutual inductance is measured by exciting, via a switching excitation system 106 included in the transmitter 102, the transmitter coils LT1, LT2, LT3 with relatively large, time-varying currents, and measuring, via a computing device 108 included in the receiver 104, the voltages induced in each of the receiver coils LR1, LR2, LR3 by the resulting electromagnetic fields. Multiplying the measured voltages by a set of calibration coefficients gives the inductances from which the position and orientation of the remote object are derived. Signed values of the measured mutual inductances are used to find the geometric data unambiguously.

The output of each receiver coil LR1, LR2, LR3 is the sum of the voltages (e.g., 3 voltages) induced by the electromagnetic field from each transmitter coil, plus any voltage from interfering electromagnetic fields. The received signals can be separated by time multiplexing the excitation of the three transmitter coils LT1, LT2, LT3, i.e., no two transmitter coils receive current at the same time. This technique can be extended to continuous, simultaneous excitation of the transmitter coils LT1, LT2, LT3 with the received signals being separated by band-pass filters 114 before performing analog-to-digital (A/D) conversion by an ADC 110.

In the presently disclosed embodiment, the transmitter electromagnetic fields from all three transmitter coils LT1, LT2, LT3 oscillate continuously, so the output of each receiver coil LR1, LR2, LR3 is always the sum of three source signals. To enable the separation of the amplitudes of the three received signals at each receiver coil, a unique set of relations is imposed between the excitation frequencies of the transmitter coils LT1, LT2, LT3 and the A/D converter sampling frequency of the ADC 110 such that, under a suitable metric, the output signals of the ADC 110 for different source frequencies are orthogonal to one another. The application of this metric with a suitable set of basis functions separates the received signals.

Figure 2A:
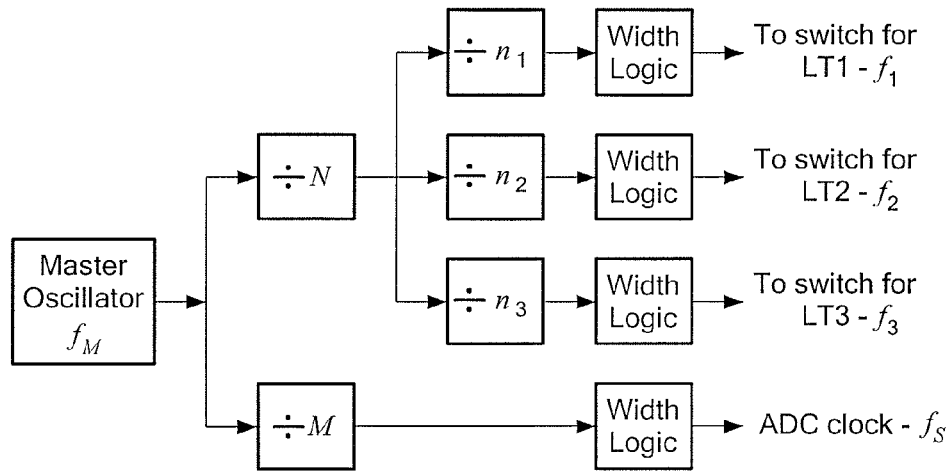
FIG. 2a is a block diagram illustrating the generation of switch activation signals with requisite frequency properties for driving parallel resonant transmitter coils included in the system of FIG. 1, thereby developing large, approximately sinusoidal currents in the respective coils.

In the presently disclosed embodiment, the three excitation frequencies of the transmitter coils LT1, LT2, LT3 satisfy the following conditions:

1. All excitation frequencies in the switching excitation system 106 and the sampling rate of the ADC 110 are derived from a common master clock generator 112 by integer division of its output. FIG. 2a depicts one exemplary technique by which this may be accomplished.

2. The ratios of the three excitation frequencies are small integers with no common factor, that is, $f_1:f_2:f_3=n_1:n_2:n_3$, in which $n_1$, $n_2$, $n_3$ are mutually prime. In one embodiment, $n_1=8$, $n_2=9$, and $n_3=10$. The implication of this choice is that one can choose another integer, N, such that $$f_1 = \frac{f_M}{n_1 N}, f_2 = \frac{f_M}{n_2 N} \text{ and } f_3 = \frac{f_M}{n_3 N}, \tag{1}$$

where "$f_M$" is the master clock frequency. Another implication of this choice is that there exists a length of time, $$T_{REP} = \frac{n_1 n_2 n_3 N}{f_M C_F}$$

during which all three excitations execute an integer number of cycles. The factor $C_F$ is 1 if the set $n_1$, $n_2$, $n_3$ have no common factor between any pair, or, if there is a common factor between one pair of these integers, then $C_F$ is that factor. For example, in the embodiment with $n_1=8$, $n_2=9$, and $n_3=10$, the value of $C_F$ is 2 because 8 and 10 are each divisible by 2. In this embodiment, the first transmitted signal executes precisely $$\frac{n_2 n_3}{C_F} = 45$$

cycles, the second transmitted signal executes $$\frac{n_1 n_3}{C_F} = 40$$

cycles and the third transmitted signal executes $$\frac{n_1 n_2}{C_F} = 36$$

cycles during the interval $T_{REP}$.

3. The clock rate of the ADC 110 is chosen such that there is a sufficient number of samples per cycle of the highest frequency transmitted signal to measure that signal properly, and such that there is exactly an integer number of samples taken in the period $T_{REP}$. Let K be the number of samples in $T_{REP}$. Since the A/D converter clock is derived by dividing the master clock by some integer M, this means that M and N are chosen so that $$K \frac{M}{f_M} = T_{REP} \text{ or } K = \frac{n_1 n_2 n_3 N}{M C_F} \quad (2)$$

is an integer relation. For example, in the embodiment with $n_1=8$, $n_2=9$, and $n_3=10$, N=92 and M=16 may be chosen, making K=207 samples. The choice of $f_m=15.36$ MHz results in a sampling rate of 96 KHz, generator frequencies of $f_1=20.869.6$ Hz, $f_2=18550.7$ Hz, and $f_3=16695.7$ Hz, and a repetition period of $T_{REP}=2.6934125$ msec.

4. Each transmitter frequency is sufficiently high that DC, low-frequency magnetic noise in the room, and expected noise sources such as CRT yokes at 15,750 Hz and its harmonics generate only minimal noise in the received signals. Typically the transmitter frequencies lie between 10 KHz and 25 KHz excluding 15 KHz to 16.5 KHz.

5. Each transmitter frequency is sufficiently low that there is little concern about compliance with FCC standards for electromagnetic interference from it or its significant harmonics.

6. The transmitter frequencies are not spread too far apart so each sensor coil signal requires only the single band-pass preamplifier 114 (see FIG. 1) before the ADC 110 to handle all three components of the received signal.

To understand the utility of these choices for excitation and sampling frequencies, consider the signals at the output of the ADC 110 in the receiver. Neglecting any phase shift between the transmitter coil currents and the inputs of the ADC 110, these signals can be expressed as $$S_l = \sum_{i=1}^{3} A_{il} \cos(2\pi f_i t) + \upsilon_l(t), \ l = 1, 2, 3$$

where "$\{A_{il}\}$" represents the voltage induced in the l'th receiver coil by the i'th transmitter coil, and "$\upsilon_l(t)$" is the noise in this receiver channel from amplifier noise and competing sources of electromagnetic fields. Those of ordinary skill in the art of signal processing will appreciate that this analysis can be extended to take into account phase shifts. The values of $\{A_{il}\}$ are the information needed to resolve the position and orientation of the remote object associated with the receiver 104. They are implicitly functions of time, as the remote object may be moving.

After A/D conversion by the ADC 110, the computing device 108 receives discrete samples of the signals at the output of the ADC 110 for all three receiver coils. Let k be the time index of the signal samples, and let $$T_S = \frac{M}{f_M}$$

be the time between A/D converter samples. Then, the input to the computing device 108 includes multiple sets of samples, one set for each receiver coil LR1, LR2, LR3, i.e., $$S_l(k) = \sum_{i=1}^{3} A_{il} \cos(2\pi f_i k T_S) + \upsilon_l(t_k) = \sum_{i=1}^{3} A_{il} \cos\left(2\pi \frac{n_i k}{K}\right) + \upsilon_l(t_k),$$

in which $t_k = k T_S$.

Now, a set of basis functions $$\left\{\varphi_i(k) \equiv \cos\left(2\pi \frac{n_i k}{K}\right)\right\} i = 1, 2, 3$$

is defined. An inner product on these functions is also defined as $$\langle \varphi_i | \varphi_j \rangle = \sum_{k=k_0}^{k_0+K-1} W_{k-k_0+1} \varphi_i(k) \varphi_j(k) \quad (3)$$

where "$\{W_k\}$" is a set of weights that are equivalent to a windowing function, and "$k_0$" is the time index of the beginning of a frame of K samples. If the noise is white, then the optimal values for the weighting coefficients are all unity. In this case, it can be proven that $$\langle \varphi_i | \varphi_j \rangle = \begin{cases} \frac{K}{2} & \text{if } i = j \\ 0 & \text{if } i \neq j \end{cases}$$

Those of ordinary skill in the art of digital signal processing (DSP) will appreciate that when the noise is colored by interfering electromagnetic sources, it is possible to change the values of $\{W_k\}$ to improve the noise rejection without compromising the orthogonality of the functions $\{\phi_i\}$. Thus, because of the choice of the transmitter and sampling frequencies, the basis functions of the received signals are orthogonal. To extract the desired data, the computing device 108 calculates $$\langle S_l | \varphi_i \rangle = \frac{K A_{il}}{2} + \langle v_l | \varphi_i \rangle.$$

This result assumes that the receiver 104 is sufficiently stationary so that the $\{A_{il}\}$ do not change significantly during the interval $T_{REP}$, and therefore the $\{A_{il}\}$ can be factored out of the inner product. The noise is uncorrelated with the transmitter excitations, so the noise term in this expression has zero mean and small amplitude. The data coefficients $\{A_{il}\}$ are estimated by neglecting the noise as $$A_{il} \cong \frac{2 \langle S_l | \varphi_i \rangle}{K}.$$

To improve the signal-to-noise ratio, the summation in the inner product (see equation (3) above) can be extended over more samples without affecting orthogonality if the number of summed terms is an integer multiple of K. This reduces the rate at which position and orientation estimates are generated in return for lower noise. In one embodiment, the number of summed samples is 5·K, and new position and orientation estimates are produced every 13.6 msec, or at a rate of 75 samples per second.

The structure of the equations for the transmitter excitation frequencies (see equation (1) above) and the A/D converter sampling rate (see equation (2) above) leads directly to ways to generate pulse trains of any duty cycle at the required frequencies. The exemplary embodiment depicted in FIG. 2a is based on counters with modulus values set by equations (1) and (2) above.

Figure 3:
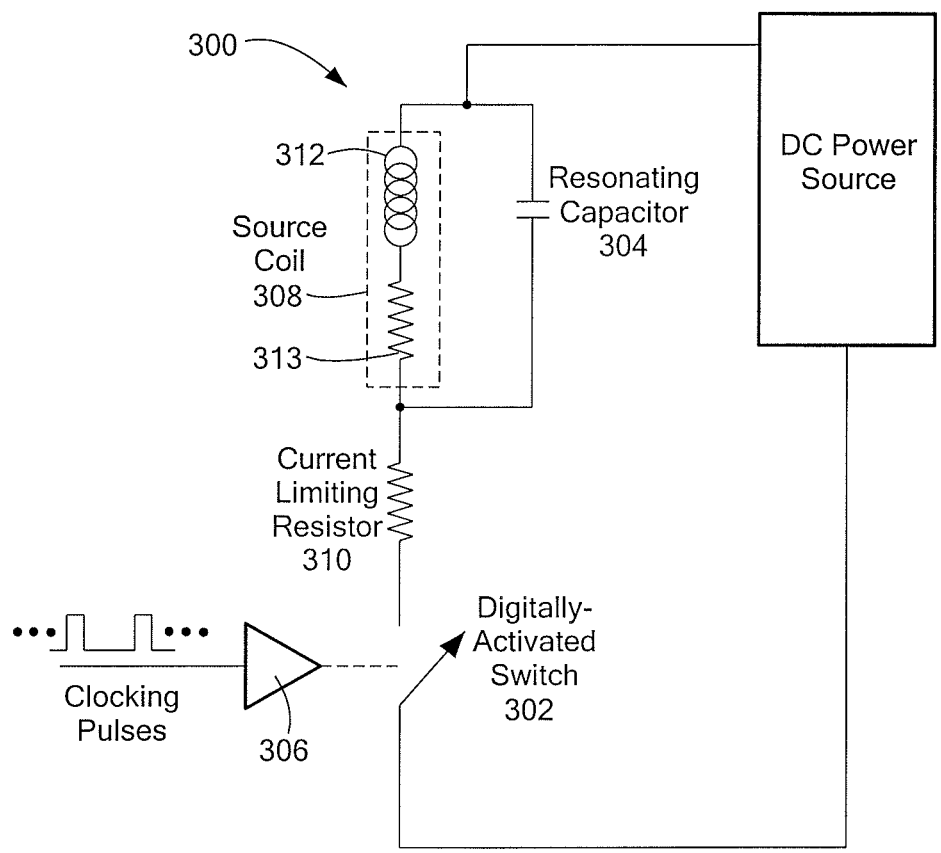
FIG. 3 is a schematic diagram of a switch and resonating capacitor configuration for generating continuous sinusoidal currents in the transmitter coils included in the system of FIG. 1.

The ability to generate pulses of the correct frequency does not completely solve the problem of generating high magnetic fields that vary sinusoidally at acceptable cost. FIG. 3 depicts an illustrative parallel resonant inductor-resistor-capacitor circuit 300 that addresses this problem, using a switch 302 and resonating capacitor 304 to generate continuous sinusoidal currents in the transmitter coils LT1, LT2, LT3 efficiently and at low cost. As shown in FIG. 3, digitally generated clocking pulses are applied to the circuit 300 via a buffer 306, thereby controlling the digitally-activated switch 302.

As further shown in FIG. 3, an inductor 312 and a resistor 313 disposed in the dashed box represent one of the three transmitting coils LT1, LT2, LT3. The resistance of the source coil 308 is the principal cause of energy use in the transmitter 102, and lowering this resistance minimizes power. Those of ordinary skill in the art of magnetic coil design will appreciate that there are techniques for lowering such coil resistance. The capacitor 304 in parallel with the source coil 308 converts the circuit 300 into a parallel resonant circuit. This capacitor 304 corresponds to one of the three capacitors CT1, CT2, CT3 included in the transmitter 102 of FIG. 1. Such resonant circuits can sustain continuous sinusoidal currents with only periodic current impulses to make up for loss in the coil resistance. In the presently disclosed embodiment, the necessary current impulses are supplied by the digital switch 302, which is actuated by short pulses from the clock generator 112 (see FIG. 1). In one embodiment, the switch 302 is an N-channel MOSFET, but alternative devices, particularly bipolar transistors, may be used as well. A current limiting resistor 310 serves two purposes. First, it limits the inrush current in the switch 302 when the system starts up. Second, it makes the operation of the circuit 300 less sensitive to the resonant frequency of the coil-capacitor combination 304, 308. Those of ordinary skill in the art will further appreciate that there are techniques for optimizing the selection of the limiting resistor 310.

The operation of the circuit 300 of FIG. 3 differs from the operation of Class C amplifiers used for radio frequency (RF) power generation in that the conduction angle of the circuit is substantially smaller than that normally used in Class C circuits. In one embodiment, the switch 302 is closed for about 1 microsecond in a cycle that is typically about 50 microseconds. In other embodiments, the closure time ranges from 0.5 to 1.5 microseconds. This range corresponds to conduction angles of 5 to 15 degrees in comparison to the normal Class C practice of 20 to 40 degrees in RF circuits.

The distance over which the position of a remote object can be determined is a function of the strength of the transmitted electromagnetic fields. Maximizing their strengths using source coils and capacitors of reasonable cost and size may require using a DC power supply with a high voltage output. In one embodiment, this supply voltage may range from about 20 to 200 volts. It is noted, however, that such supplies may prove to be too expensive for some applications.

Figure 4:
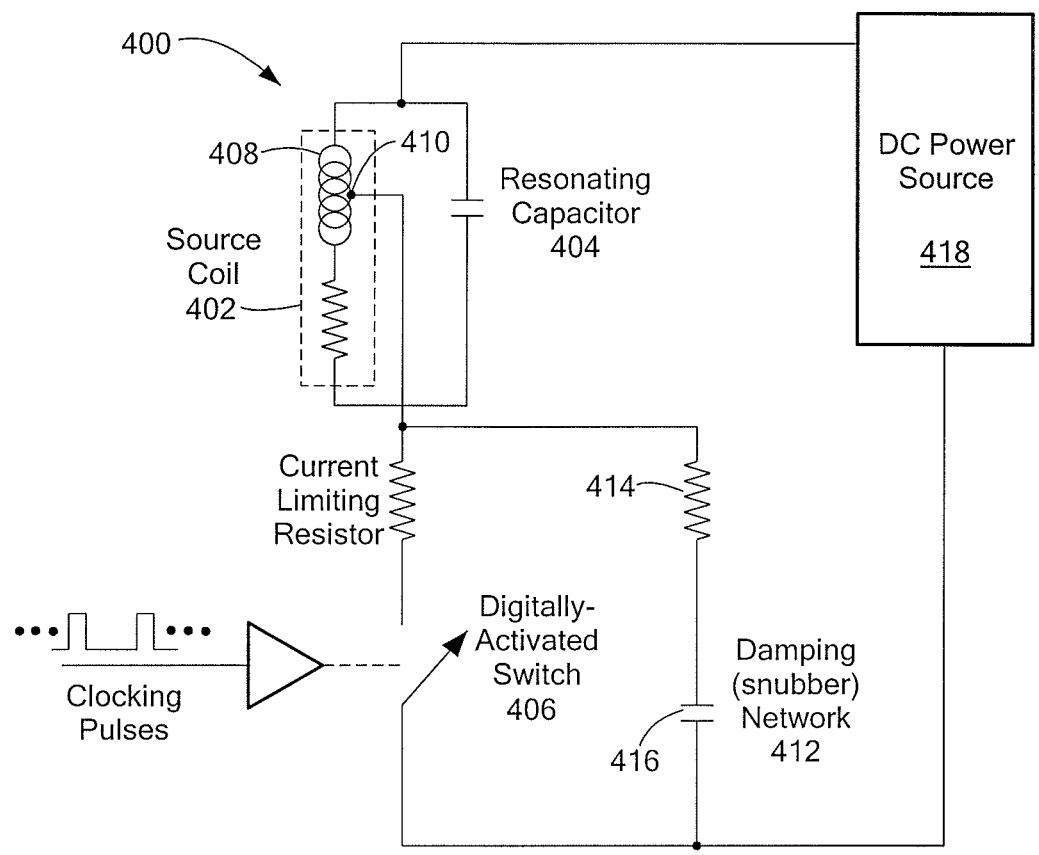
FIG. 4 is a schematic diagram of a circuit configuration using tapped coils wound with bifilar or trifilar wire to reduce the supply voltage in the transmitter coil excitation circuitry included in the system of FIG. 1.

FIG. 4 depicts an illustrative circuit 400 in which a tapped source coil 402 may be used to reduce the required voltage output by a factor of two or three. The coil 402 in this circuit acts as an autotransformer. Applying current pulses to one portion of the coil 402 results in a stepped-up voltage across the entire coil and a capacitor 404 that forms the parallel resonant circuit.

The two sections of the autotransformer coil 402 of FIG. 4 are very tightly magnetically coupled. If they are not, then the resulting leakage inductance causes transient ringing when the digital switch opens. This "kickback" voltage is undesirable for two reasons. First, if the voltage is too high, then it may destroy the digitally-activated switch 406. Second, this voltage is usually a decaying sinusoid at a much higher frequency than the correct excitation. It is often sufficiently high so as to generate electromagnetic interference beyond what is acceptable for compliance with FCC regulations.

To guarantee the appropriate coupling between sections of the source coil 402 in the circuit 400 of FIG. 4, the coil 402 is wound with bifilar or trifilar wire. It is noted that bifilar wire leads to a 2-to-1 reduction in supply voltage, and trifilar wire leads to a 3-to-1 reduction in supply voltage. After winding, the four or six ends of the coil are connected in such a way as to make a single series inductor 408. One of the connections between one pair of the ends of the multi-conductor wire becomes a tap 410. To prevent any ringing from residual leakage inductance, a snubber network 412 including a resistor 414 and a capacitor 416 is connected in series between the switched end of the autotransformer coil 402 and one terminal of a power supply 418, as depicted in FIG. 4.

One practical difficulty with impulse excitation of a passive parallel resonant inductor-capacitor circuit is that the natural resonant frequency given by $$f_i = \frac{1}{2\pi\sqrt{L_{Ti}C_{Ti}}}$$

must be within a fraction of a percent of the desired excitation frequency. It is generally not cost-effective to manufacture coils and capacitors to that tolerance, nor is it desirable to adjust their values while assembling the transmitter 102. Moreover, component values are temperature dependent, and, to assure that users have a satisfactory experience in varied conditions, it may be necessary to adjust the system for such temperature effects.

Figure 5:
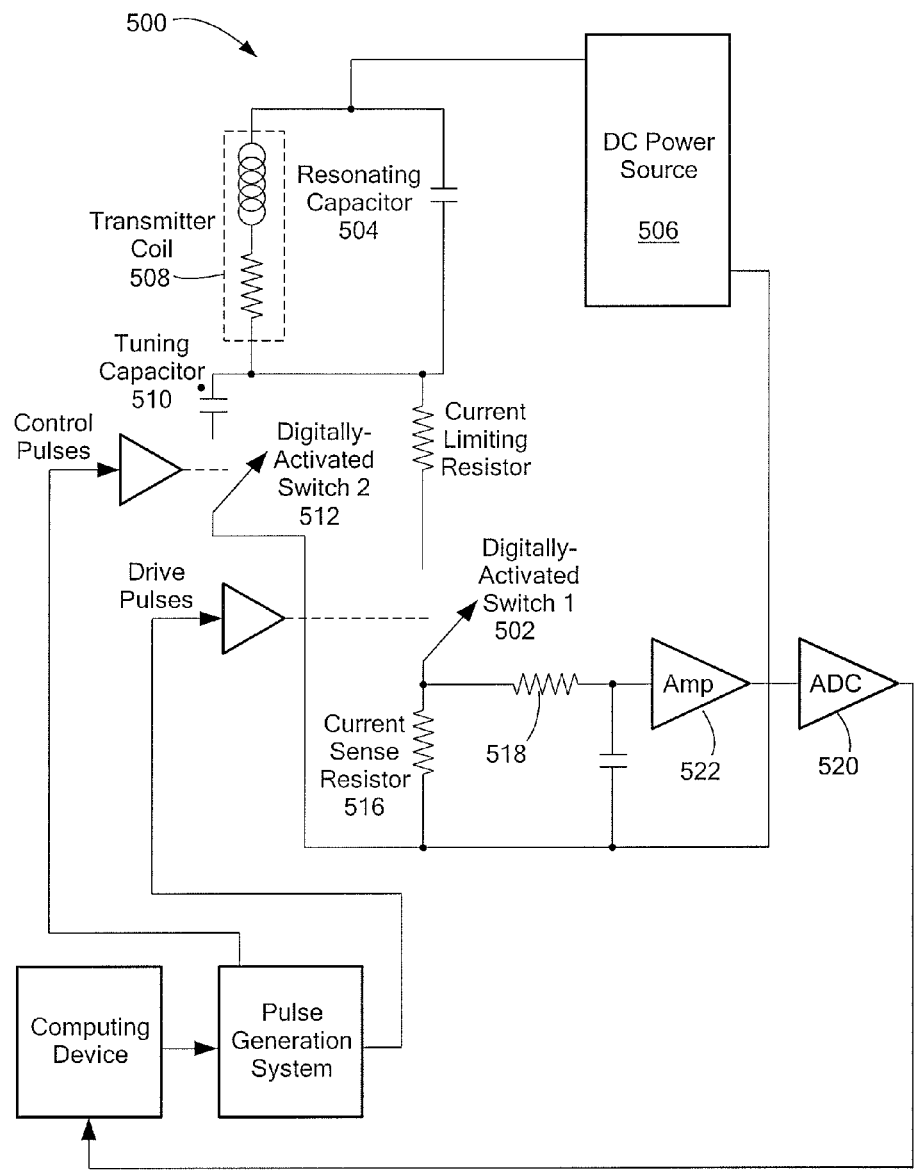
FIG. 5 is a schematic diagram of an automatic tuning circuit for compensating for component tolerances and temperature and aging effects in the resonant coil-capacitor structures of the transmitter included in the system of FIG. 1.

FIG. 5 depicts an illustrative circuit 500 configured to address this problem. A digitally activated switch 502, together with a resonating capacitor 504, a power supply 506, and a transmitter coil 508 implement substantially the same basic functionality as the circuit 300 of FIG. 3. A second capacitor 510 is added effectively in parallel with the resonating capacitor 504 for part of each cycle of the coil current by a second digitally activated switch 512. When switch 512 is open, the value of the resonating capacitor 504 is set so that under worst-case conditions of temperature and component tolerance, the resonating frequency is above the optimal frequency by about 1-5 percent. Adding additional capacitance lowers the resonant frequency, slowing the circuit down. The value of the tuning capacitor 510 is chosen such that the resonance frequency would be slightly (e.g., 1-5 percent) below optimal for worst-case conditions if the switch 512 were closed all the time.

Figure 2B:
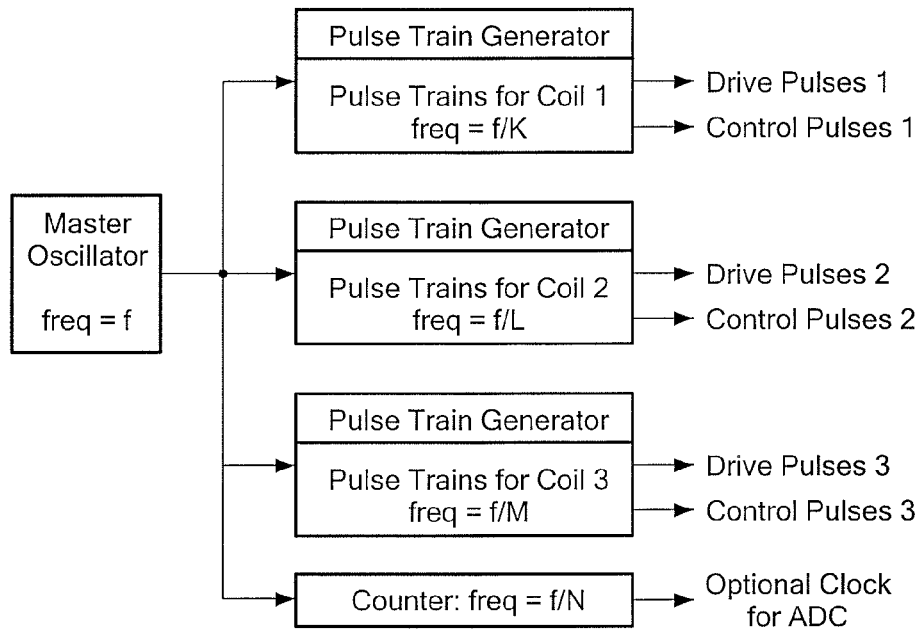
FIG. 2b is a block diagram illustrating the generation of switch activation signals for multiple switches used for automatically tunable resonant circuits included in the system of FIG. 1.

FIG. 2b depicts an illustrative modified clock generator system operative to supply both a short pulse to activate the switch 502 and a longer overlapping pulse to activate the switch 512. By closing the switch 512 for an appropriate fraction of each cycle, it is possible to guarantee that the circuit 500 is resonant with the correct period regardless of the component values.

Figure 2C:
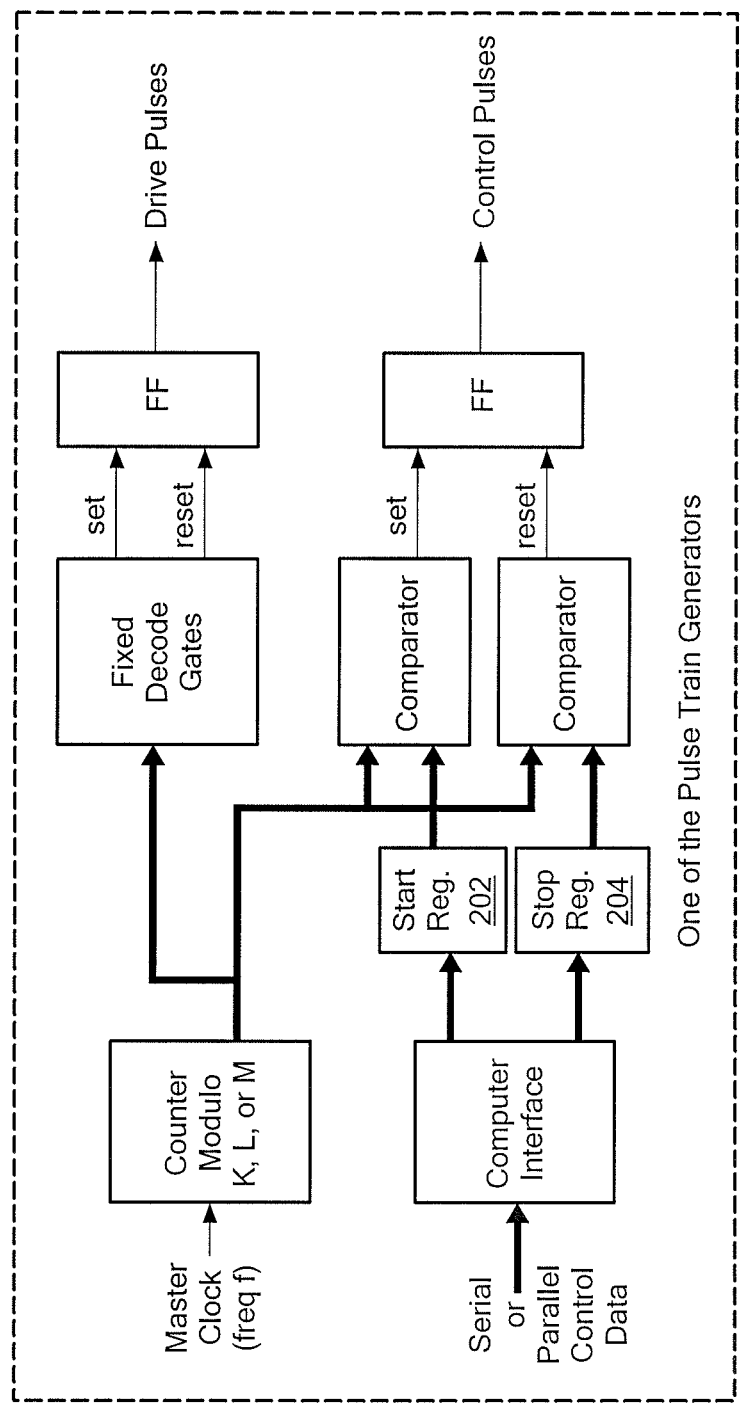
FIG. 2c is a block diagram illustrating logic employed in the generation of the switch activation signals of FIG. 2b.

A computing device 514 in the circuit 500 sets the timing for the switch 512 to meet this requirement. In one embodiment, as shown in FIG. 2c, it does so by writing to start and stop registers 202, 204 in the pulse train generation circuitry. In another embodiment, the gate pulses for both switches 502, 512 (see FIG. 5) are generated in pulse-width modulators that are peripherals in a microcontroller that also contains the computing device 514 that derives the pulse widths for the switch 512. In each of these embodiments, the effect is substantially the same.

The computing device 514 determines the optimal timing for the closure of the switch 512 by minimizing the power drawn by the entire resonant circuit. The voltage across a current sense resistor 516 in the source lead of the switch 502 is filtered by an R-C low-pass filter 518, amplified by an amplifier 522, and applied to an A/D converter 520. The computing device 514 reads the output of the ADC 520 and adjusts the closure of the switch 512 to minimize the current. The timing for opening and closing the switch 512 is such that the switch 512 closes when the voltage across its source-drain is zero. This guarantees minimum loss from the additional circuitry and guarantees that there is no net DC current through the switch 512 that would affect the estimation of power from the current in the switch 502.

In another embodiment, a single current sensor either on the overall power supply or the high-voltage power supply for the coils can be used to set the tuning pulse durations and phases for all three coils. During a short initialization time after transmitter startup, the computing device activates one coil at a time and determines the pulse settings to be used later when all coils are turned on for operation. This reduces the cost of implementing the tuning. Those of ordinary skill in the art of circuit design will appreciate that this tuning mechanism may also be used to allow the system to change the operating frequencies with no loss of resonance. Such a change may be used to allow close placement of independent transmitters without interference by giving each transmitter a different set of frequencies. Such placement of transmitters might occur for users of systems in adjacent office or other areas.

Single Report Solution to Resolve Signs in 3-Sine Non-Coherent System

As shown in FIG. 1, there may be a connection 116 between the clock generator 112 of the transmitter 102 and the ADC 110 of the receiver 104 to set the sampling rate. In many tracking applications, such a physical connection is undesirable, particularly for those systems in which the position and orientation data are reported wirelessly. The need for the connection 116 is eliminated by a technique that exploits the periodic phase relationships of the transmitted signal to resolve both the amplitude and the sign of the coefficients $\{A_{il}\}$. These phase relations exist because of the selection of excitation frequencies, as described above. That set of restrictions guarantees that the relative phases of the three excitations are periodic in $T_{REP}$.

For operation without synchronization to the transmitter 102, there must be a source for the ADC clock in the receiver 104 itself. FIG. 1 shows such an alternative in a local clock generator 118. In the clock generator 118, the output of a second independent master clock oscillator at approximately the same frequency as the transmitter oscillator is divided down to produce a sampling clock for the ADC 110 at nearly the same rate as would have been produced by the transmitter 102, as described above. In one embodiment, the two master oscillators use identical inexpensive quartz crystals that guarantee the two oscillator frequencies differ by less than 60 ppm.

Because the transmitter and receiver oscillators have different frequencies, the phase shift between the transmitted signals and the receiver sampling changes slowly but continuously. This makes it necessary for the computing device 108 to determine the phases of the components of the received signals as well as their magnitudes as part of finding the properly signed values of the mutual inductances. The procedure for finding the magnitudes is similar to that described above for a system having the ADC clock generated in the transmitter 102. Without that synchronization, it is necessary to use two sets of basis functions, $$\left\{\varphi_i(k) \equiv \cos\left(2\pi\frac{n_ik}{K}\right)\right\} i = 1, 2, 3$$

and $$\left\{\psi_i(k) \equiv \sin\left(2\pi\frac{n_ik}{K}\right)\right\} i = 1, 2, 3.$$

If the difference between the transmitter and receiver master oscillator frequencies is sufficiently small, then the orthogonality property of the inner products of the transmitted signal components with these receiver basis functions is preserved over the summation period $T_{REP}$. In one embodiment, the error due to the frequency difference is minimized by small adjustments to the number of summed samples and the weights $\{W_i\}$ in the definition of the inner product (see equation (3) above).

Taking the inner product of the six basis functions with the ADC output samples yields both sine and cosine component amplitudes for each frequency at each receiver coil. From the sine and cosine amplitudes, one can infer the continuous signal voltages present at the receiver coil terminals. Let $V_i$ be the output of one sensor coil in the receiver 104 at the i'th frequency. Here we use a "phasor" form to represent that signal as, $$V_i = X_i \cos(\omega_i t) + Y_i \sin(\omega_i t) \text{ for } i=1, 2, 3, \text{ where}$$
$$\omega_i = 2\pi f_i.$$

The magnitude of such a signal is $|V_i| = \sqrt{X_i^2 + Y_i^2}$. However, this does not resolve the sign of the amplitude. If a receiver coil were flipped 180 degrees, that rotation could not be determined from this calculation. For a magnetic tracking system, the sign of the signal relative to the transmitter is generally required for computing both position and orientation.

Figure 6:
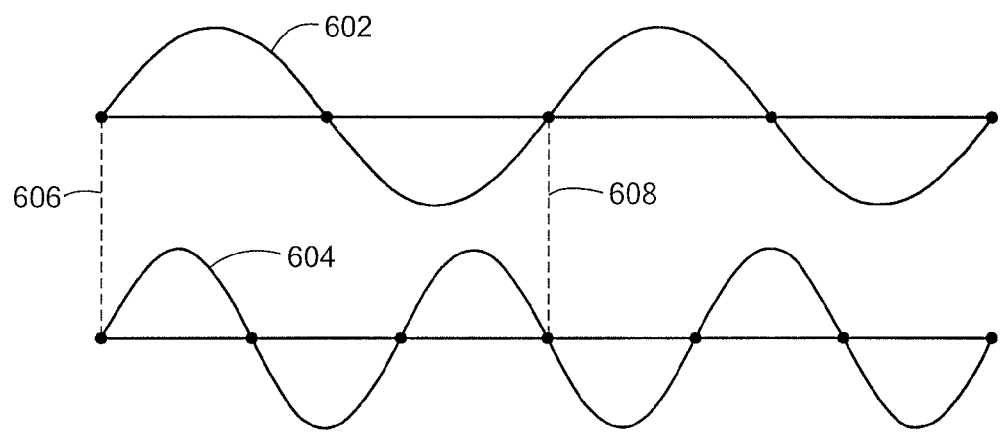
FIGS. 6-10 are diagrams for use in illustrating a non-synchronized technique for determining the signed values of the mutual inductance coupling between the multiple receiver coils and the multiple transmitter coils included in the system of FIG. 1.
Figure 7:
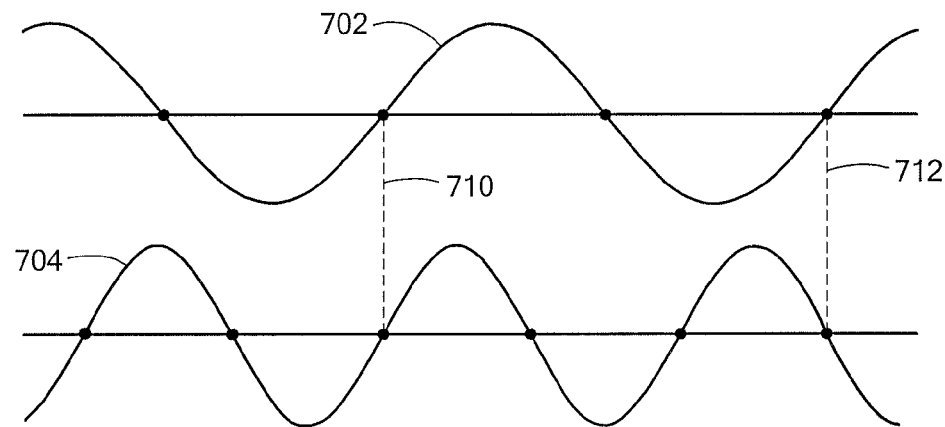

One solution is to transmit an additional signal such as a synchronization pulse at the beginning of each sample window. This requires additional hardware, raising the cost of the system. In the presently disclosed embodiment, the signs are resolved without a sync pulse by looking at all three frequencies simultaneously. For example, FIG. 6 depicts illustrative sine waves 602, 604 for a two-channel system with frequencies in a ratio of $f_1:f_2=2:3$. The sampling window is an exact multiple of the periods of both sine waves 602 and 604. Moreover, the window is the minimum length that satisfies that condition so the length is what is called $T_{REP}$ in the discussions above. It is noted that, as discussed above, data blocks from integer multiples of this period may also be used to make a position and orientation estimate. As shown in FIG. 6, the window is synchronized with the common zero crossing 606 of the two waves where both signals transition from negative to positive. This signal pattern is possible as a result of the restrictions imposed on the transmitter excitation frequencies. Because the transmitter 102 and the receiver 104 are not synchronized, the received signals may be shifted by some arbitrary amount of time, as illustrated by sine waves 702, 704 depicted in FIG. 7.

The goal is to find this time shift as the starting time for calculating the inner products that estimate the signed sensor voltage magnitudes. First, it is noted that the start of the window occurs in a place where all of the sine waves (two sine waves 702, 704 in this example, but three sine waves in the full system) cross the horizontal axis simultaneously. There are two solutions for the time shift, namely, the "correct" delay to point 710, and a "wrong" delay to point 712 that occurs halfway through the proper window. The wrong solution can be detected in a later step, by testing the determinant of the solution matrix. The matrix derived with the correct delay has a positive determinant, while the incorrect delay causes a negative determinant. If the determinant is found to have the incorrect sign, then some predetermined column vectors (specifically, those frequencies with an odd number of cycles in the sample window) of the matrix are negated to get the correct solution. The problem then is reduced to finding the start of the window to the nearest half-window, so that finding either solution will be sufficient.

For each sensor coil, the phases of the three frequency components are calculated as follows.

$$p_1 = \tan^{-1}(Y_1/X_1)$$

$$p_2 = \tan^{-1}(Y_2/X_2)$$

$$p_3 = \tan^{-1}(Y_3/X_3)$$

For a system with multiple sensor coils, it is possible to improve the accuracy of these estimates of the phase of the data window relative to the data sinusoids by combining the phases so determined from all coils. To do so, the phases of all sensor coils at each frequency are added together, with a weighting proportional to the squared magnitude of each signal. It should be noted that each of the 9 signals will have a static phase offset. These offsets are found during a calibration process, and are removed before the signals from the sensors are combined. The phase of each sine wave relative to the data window changes as that window shifts in time. Consider the different frequency components at the output of one sensor coil $\{V_i\}$ for i=1, 2, 3 as defined above. In magnitude and phase notation, these may be written as $V_i = |V_i| \cdot \cos(\omega_i t + p_i)$ for i=1,2,3. If the data window is shifted by some delay $\tau$, then the voltages become $V_i = |V_i| \cdot \cos(\omega_i t + \omega_i \tau + p_i)$ for i=1, 2, 3, from which we conclude that the new phase of each sine wave is $\omega_i \tau + p_i$ and that the change of phase with the time shift of the window, $\omega_i \tau$, is proportional to its frequency.

Figure 8:
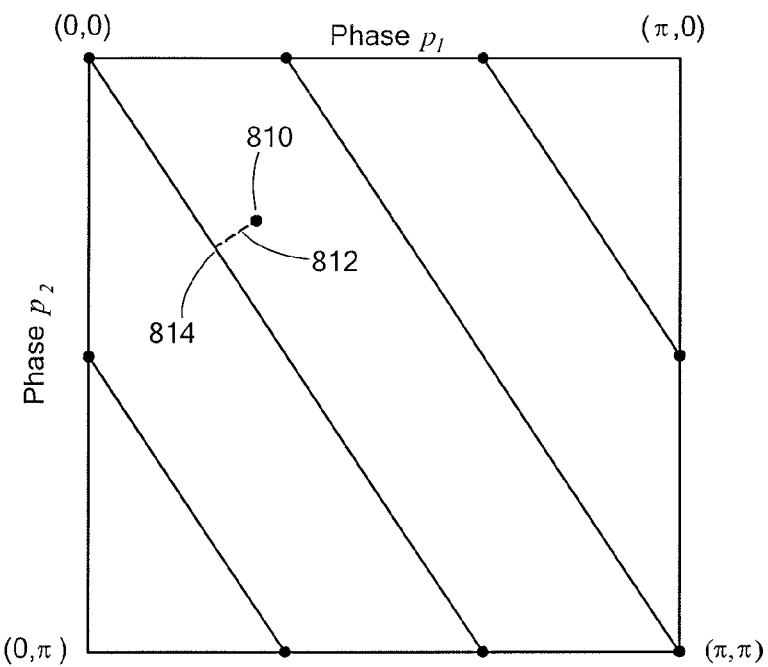

FIG. 8 depicts phase $p_1$ versus phase $p_2$ for all possible time shifts of the window. The phases are computed modulus $\pi$ and therefore wrap around at each edge of the graph. For a window with no time shift, the phases $p_1$ and $p_2$ would both be equal to 0; this condition corresponds to the point "0, 0" at the top-left corner (or actually any corner due to wraparound) of the diagram of FIG. 8. As time is shifted, the signal $p_1$ increases while the signal $p_2$ increases at a slightly faster rate. In the two-dimensional example of FIG. 8 based on the sine waves of FIG. 7, the slope is 3/2. The path wraps around from bottom to top, then right to left, then bottom to top, and finally reaches the bottom-right corner (point "$\pi, \pi$"), where it wraps back to the top-left corner (point "0, 0").

In an ideal system, any phases ($p_1$ and $p_2$) calculated from the data would fall exactly at a point on this line. This is not always the case, however, because of system noise, phase offset errors, environmental effects on the transmitter (e.g., distortion or phase pulling from adjacent metallic materials), etc. Instead, a best-fit solution is found. An example of a point 810 calculated from data is shown on the diagram of FIG. 8, with a dotted line 812 showing the shortest path to the nearest point 814 on the line. The time shift corresponding to point 814 is the desired time shift for the data window. It is noted that wrap-around is taken into account in this distance calculation. The distance along the path, from the top-left corner (point "0, 0") to the bottom-right corner (point "$\pi, \pi$"), including wraps, corresponds linearly to a time shift of the window by a time from $\tau=0$ to $\tau=T_{REP}$, the length of one period of phase synchronization.

Figure 9:
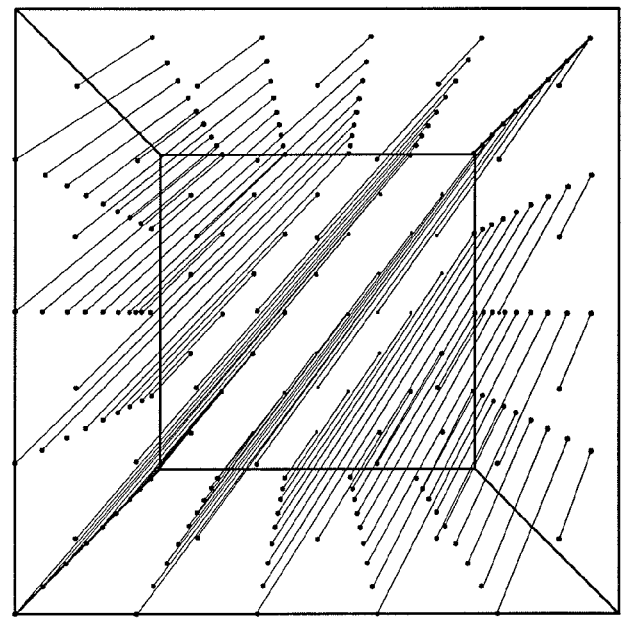

For a system with three channels, the phase plot $p_1$ versus $p_2$ versus $p_3$ still forms a line, but it wraps around a 3-dimensional cube. FIG. 9 depicts an illustrative 3-dimensional phase plot. As in the 2-dimensional phase plot of FIG. 8, solving for the time shift requires finding the closest point on this wrapped-around line. One solution employs the following code in the C programming language:

```
for (k=0;k<PI;k+=.001)
{
    dist = distance(p1, p2, p3, fmod(w1*k,PI), fmod(w2*k,PI), fmod(w3*k,PI));
    if (dist < mindist) { mindist = dist; bestk = k; }
}
```

It is noted that this technique may be slow, as the step size is small to get sufficient accuracy, the execution time is long. Fortunately, a fast direct solution exists for finding the closest point accurately.

Figure 10:
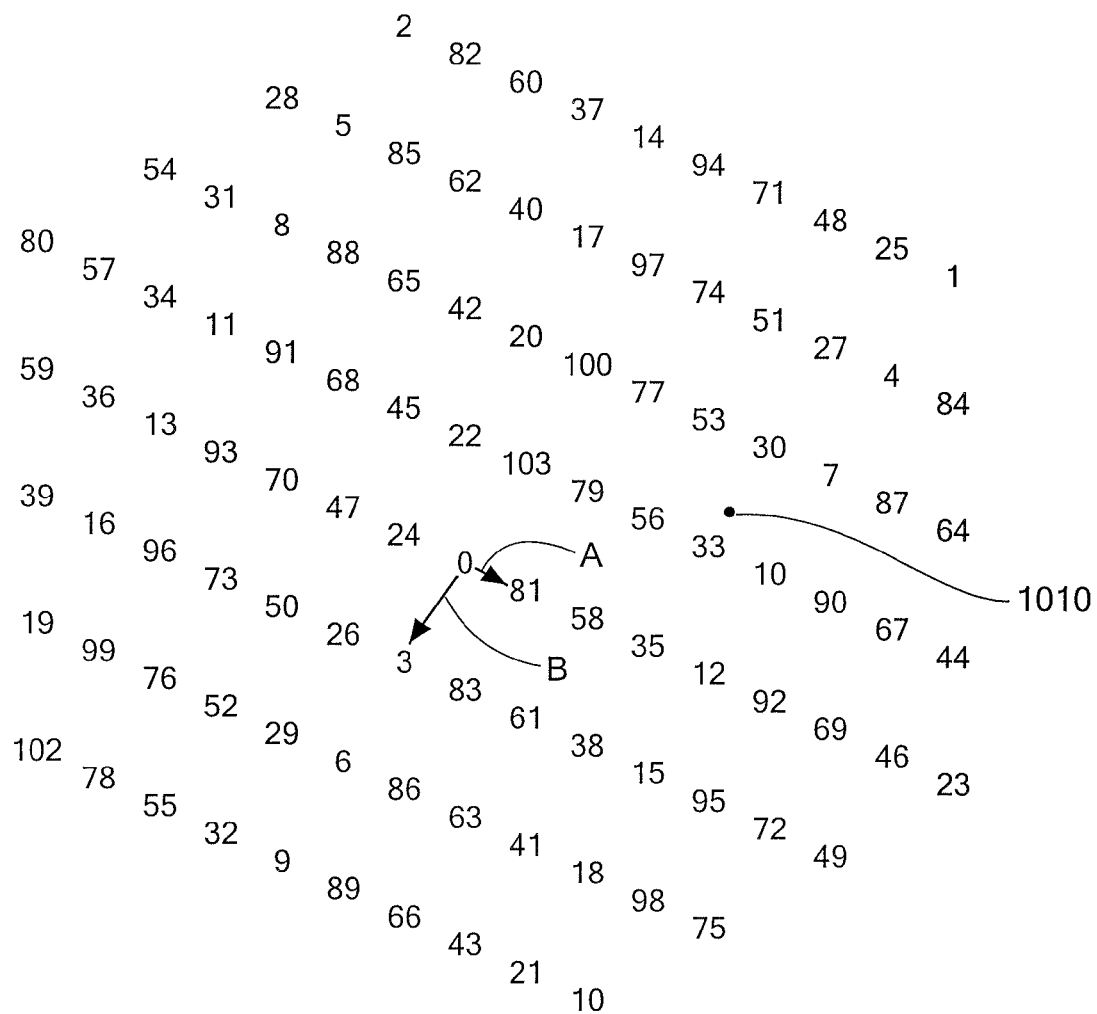

All of the line segments in FIG. 9 are parallel, and a plane perpendicular to any one line is perpendicular to all of them. If the cube of FIG. 9 were viewed so that the lines all face the viewer, and if the lines are projected through a plane perpendicular to the line of sight, then the points where line segments intersect the plane would look like dots in a sheared grid pattern. FIG. 10 depicts such a projection for purposes of illustration. As shown in FIG. 10, the dots have been replaced with numbers sorted by the distance or time delay of one end of the corresponding segment along the wrap-around path. A measured phase point projects onto this plane as a test point (x, y) shown as a point 1010 in FIG. 10. The goal becomes finding the closest dot in the grid to this test point. The distance to every dot could be checked, but there is a faster way. The pattern can be modeled by two basis vectors. In this example, a good choice of vectors would be a vector A from dot 0 to dot 81, and a vector B from dot 0 to dot 3. All dots can be reached by adding integer combinations of these two vectors A, B. Finding a nearby dot is done by using Cramer's rule to solve for u and v in the following set of linear equations:

$$x = u^* A_x + v^* B_x$$

$$y = u^* A_y + v^* B_y$$

The solution, u and v, is then rounded to the nearest integer. Because this does not necessarily find the closest dot (as measured by the Pythagorean distance), a search in the 3×3 neighborhood around dot u, v is done, using the Pythagorean distance to pick the closest dot.

Once the closest dot (or line segment in 3-dimensions) is found, the distance along the particular line segment is calculated using a dot product. The lengths of all previous line segments along the path are added to calculate the overall time shift k. Lookup tables store the length of each line segment, the cumulative length of all previous line segments, and the starting point of each line segment (for the dot product).

Once the time shift τ is found, each phasor $X_i$, $Y_i$ without time shift can be calculated by rotating it by $-\omega_i \tau$ as, $$X_i' = -X_i \cos(-\omega_i \tau) + Y_i \sin(-\omega_i \tau) \text{ and}$$

$$Y_i' = -Y_i \cos(-\omega_i \tau) - X_i \sin(-\omega_i \tau).$$

$Y_i'$ may be discarded because the real component $X_i'$ holds the amplitude with the desired sign. The final step is to resolve which half of the window the time shift is in. For a system with three sensor coils, nine $X_i$'s are found. The sign of the determinant of this 3×3 matrix determines which side of the window is the correct one.

Calibration Technique for a Magnetic Tracker Using Orthogonal Coils

For magnetic tracking systems, it is generally neither practical nor economical to manufacture coils that have inductance with low tolerance. Factors other than inductance can also affect detected signals, such as component tolerance in the analog amplifiers between the sensor coils and ADC inputs (such as the amplifiers 114 of FIG. 1) in the receiver or the values of the resonating capacitors in transmitter. Coil shape and analog circuitry affect the scale of the amplitude detected and add phase offsets. Calibration compensates for these factors. Calibration may be performed using hardware components and/or software techniques, and the resulting constants may be stored in non-volatile memory.

In conventional systems, this calibration process was typically part of the manufacturing process, and was typically performed once for any given transmitter-receiver pair. This limits the system to operating only with transmitter-receiver pairs that were manufactured simultaneously and likely sold as a pair. There are applications, however, such as for pointing devices in video games, that may employ multiple receivers with one transmitter. The user may wish to replace a receiver, or to increase the number of receivers after the system has been in use for a period of time. That usually provides unsatisfactory accuracy unless the system is recalibrated.

In one embodiment, a technique for calibration on-the-fly is employed that requires only minimal action on the part of the user. This technique can be applied to calibrate during manufacture, or to allow the user to calibrate a new receiver for use with an installed transmitter. Moreover, this technique may be used to detect whether a receiver is properly calibrated so that the user can be directed to take the necessary steps to improve its operation.

The on-the-fly calibration technique requires the user to move the receiver around to random locations and orientations for a period of 5-10 seconds. The resulting magnitudes and phases of all signals are then stored in an array for further processing. This procedure only has to be done once for a given receiver when it is first used with a new transmitter. The on-the-fly calibration process is described below.

Each of the three receiver coils LR1, LR2, LR3 (see FIG. 1) receives a unique frequency from each of the three transmitter coils LT1, LT2, LT3 (see FIG. 1). These frequencies are separated by DSP code for each sensor coil, as described above. The result is a 3×3 matrix of complex values. The values are complex because the phases have not yet been compensated for. The first step of the calibration technique is to determine the phase offsets.

First, it is assumed that the system is calibrated. If the system is wireless or non-coherent, then the technique described above is used to properly determine the start of the data windows. The nine complex values are then rotated to account for the time shift of the window. The result is nine values that have significant amplitude in their real components, and usually have much less amplitude in their imaginary components. The phase adjustment to add to each component can be expressed as $$\Theta_{ij} = -\tan^{-1}(m_{ij\_imag}/m_{ij\_real})$$

In a real room environment, small changes in phase may be detected, depending on the location of the test point. To find the best solution for all test points, the nine phase offsets are first adjusted to minimize the imaginary components. Then, using an iterative procedure, each phase adjustment is nudged by some fraction of a degree (randomly). The error, i.e., the sum of the absolute values of the adjusted imaginary components, is summed up for all reports sampled. If the new sum is lower than the old sum, then the new adjustment is accepted. Running 2000 iterations of this trial and error technique, and nudging by ¼ of a degree is usually sufficient. Once the iteration finishes, the complex values are adjusted as follows.

$$v_{ij} = m_{ij\_real} * \cos(\Theta_{ij}) + m_{ij\_imag} * \sin(\Theta_{ij}),$$

and the imaginary components are dropped, leaving nine real values.

Figure 11C:
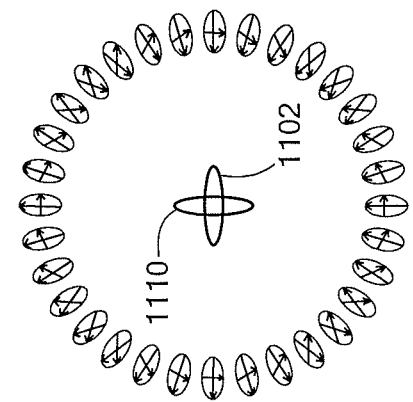
FIGS. 11a-11c are diagrams showing the magnetic-field vectors at various angles around the transmitter coils included in the system of FIG. 1.
Figure 11B:
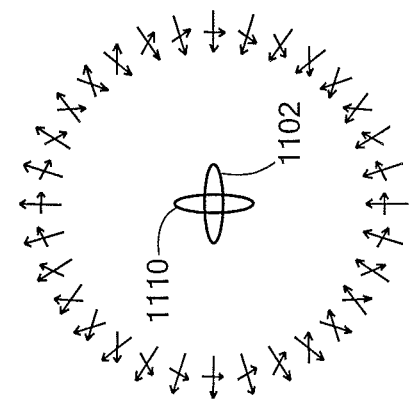
Figure 11A:
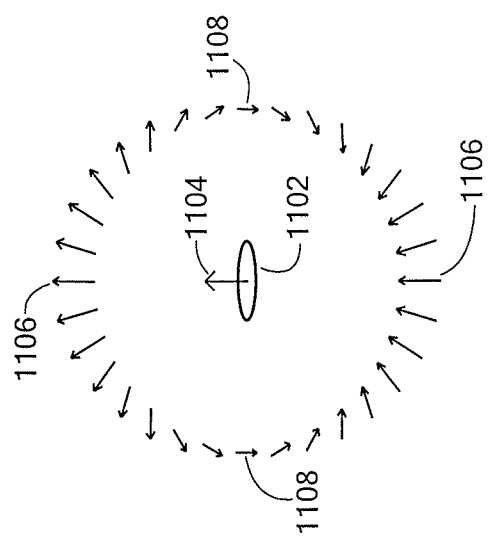

The second part of the on-the-fly calibration technique finds the scale values for each of the nine values or coil pairs. For this step, it is useful to understand the shape of a dipole magnetic field. FIGS. 11*a*-11*c* depict such a magnetic field in 2-dimensions for purposes of illustration. Specifically, FIG. 11*a* depicts a coil 1102 with a normal vector 1104 facing up.

The coil 1102 is modeled as an ideal dipole, which is reasonable at a distance equal to or greater than four times the coil's radius. The ring of arrows around the coil illustrate the magnetic field vector (direction and relative magnitude) at those angles. The magnetic field vectors 1106 on the axis (top/bottom) of the coil's normal vector 1104 are twice the length of the magnetic field vectors 1108 on the plane (left/right) of the coil 1102. FIG. 11b depicts the addition of a second coil 1110, which is orthogonal to the first coil 1102. Each test point now has two vectors, one for the first coil 1102, and one for the second coil 1110. Each of these vector pairs forms an ellipse with a 2:1 aspect ratio, as depicted in FIG. 11c.

The 2-dimensional magnetic field, as illustrated in FIGS. 11a-11c, can be extended to 3-dimensions by adding a third coil. Each test point would then have three vectors, which define an ellipsoid with 2:1:1 aspect ratio. The direction of the ellipse is unique for each angle (relative to the transmitter) in a half-space. It is noted that a half-space can be any 180 degrees of space (in 2-dimensions), or any hemisphere in 3-dimensions around the transmitter. When combined with distance (which is based on the magnitude of the vectors), a unique x, y, z position can be solved for a half-space. Once this position is determined, the orientation can be calculated. A properly calibrated system should have magnetic field vectors that form an ellipsoid with a 2:1:1 aspect ratio.

Similar to the 2-dimensional magnetic field of FIG. 11c, an ellipsoid is fitted around the three detected magnetic field vectors. The following parametric form is one way to model an ellipsoid:

$$x = v_{00}u_x + v_{01}u_y + v_{02}u_z$$

$$y = v_{10}u_x + v_{11}u_y + v_{12}u_z$$

$$z = v_{20}u_x + v_{21}u_y + v_{22}u_z$$

$$u_x^2 + u_y^2 + u_z^2 = 1$$

There are several ways to find the major axis of an ellipsoid. One way includes fitting a 3-dimensional line into a point cloud. Many points could be generated on the ellipsoid by choosing random $u_x$, $u_y$, $u_z$. It is generally sufficient to use just six points, namely, the three basis vectors and their negative counterparts, as follows.

$(v_{00}, v_{10}, v_{20})$, $(-v_{00}, -v_{10}, -v_{20})$
$(v_{01}, v_{11}, v_{21})$, $(-v_{01}, -v_{11}, -v_{21})$
$(v_{02}, v_{12}, v_{22})$, $(-v_{02}, -v_{12}, -v_{22})$

The line fitting technique starts by subtracting out the centroid of the point cloud. In this case, the centroid is 0,0,0 because the vectors and their counterparts cancel each other out. Next, a correlation matrix is formed, as follows.

$$\begin{bmatrix} xx & xy & xz \\ xy & yy & yz \\ xz & yz & zz \end{bmatrix}$$

$$xx = v_{00}^2 + v_{01}^2 + v_{02}^2$$

$$yy = v_{10}^2 + v_{11}^2 + v_{12}^2$$

$$zz = v_{20}^2 + v_{21}^2 + v_{22}^2$$

$$xy = v_{00}*v_{10} + v_{01}*v_{11} + v_{02}*v_{12}$$

$$xz = v_{00}*v_{20} + v_{01}*v_{21} + v_{02}*v_{22}$$

$$yz = v_{10}*v_{20} + v_{11}*v_{21} + v_{12}*v_{22}$$

where "$v_{ij}$" is the detected value for transmitter coil i and receiver coil j.

Next, the eigenvalues x of the matrix are solved for, by finding the solution of a cubic equation, as follows.

$$Ax^3 + Bx^2 + Cx + D = 0,$$

in which $$A = 1$$

$$B = -(xx + yy + zz)$$

$$C = xx*(yy + zz) + yy*zz - xy^2 - xz^2 - yz^2$$

$$D = (yz^2 - yy*zz)*xx + xy^2*zz + xz^2*yy - xy*xz*yz*2$$

The cubic equation above has an analytic solution. Because the input matrix is symmetric, some calculations may be simplified, and the roots are all guaranteed to be real.

Given roots $x_0$, $x_1$, and $x_2$, with $x_0$ as the largest root, a scoring function is employed to determine how close the aspect ratio of the ellipsoid is to 2:1:1. Smaller score values mean better calibration. The roots are normalized to the expected magnitude, and then its distance is compared to the ideal vector $<2^2, 1^2, 1^2>$ using a dot product, as follows.

$$f = \text{sqrt}((2^2 + 1^2 + 1^2)/(x_0^2 + x_1^2 + x_2^2))$$

$$\text{score} = (x_0*f - 2^2)^2 + (x_1*f - 1^2)^2 + (x_2*f - 1^2)^2$$

This scoring function is evaluated for each test sample taken during the 5-10 calibration period discussed above. So, for each set of $v_{ij}'$, a total score is obtained. An iterative process finds the best scale factors $k_{ij}$ applied to each $v_i$, thereby forming a new set of $v_{ij}'$, as follows.

$$v_{ij}' = v_{ij}*k_{ij} \text{ for: } i, j = \{0, 1, 2\}$$

Only one value in the set $\{k_{ij}\}$ is adjusted per iteration. The process starts by adjusting $k_{00}$ up by a small amount, and then down by a small amount. The total score is calculated each time. If the score is lower, then the new value is accepted. The process repeats for the remaining k values. If no scores were better for all eighteen attempts (up and down for each of the 9 k's), then the adjustment factors are lowered. If any scores were better, then the adjustment factor is increased.

This iterative process can be readily implemented in software, and speed is not the critical factor. Calibration generally needs to be done periodically. However, if systems are not to be shared, then such calibration may only need to be done once at manufacture. To the user, the process is fast and easy to perform; he or she merely waves the receiver around for a few seconds, and the computer handles the calibration.

Magnetic Tracking System with Transmitter including Coplanar Coils

Conventional magnetic tracking systems typically use three transmitter coils oriented orthogonal to each other. In order to obtain a useful range from such a system, each transmitter coil must have sufficient area inside it. This arrangement typically requires a relatively large box with comparable dimensions in all three directions, as all dimensions need to be large enough to allow each transmitter coil to have the required area. When using a magnetic tracking system, the user is usually looking at a television or computer screen, and not at the transmitter box. In addition, the transmitter is usually placed within 1-2 meters from the user to ensure sufficient resolution. However, a box with three large dimensions can be difficult to place near the user without it being kicked or tipped over during normal use.

Figure 12:
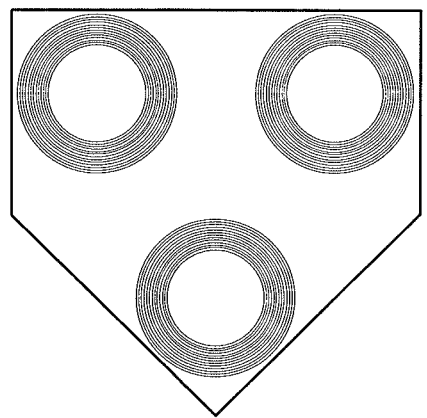
FIG. 12 is a diagram illustrating an arrangement of three coplanar transmitter coils used for generating the reference electromagnetic fields in the system of FIG. 1.

There are a number of benefits to having a transmitter that can fit inside a thin flat box. For example, for gaming applications such as baseball, the transmitter could be shaped like home plate and placed on the floor (see, e.g., FIG. 12). In the same way that a plastic chair mat blends into the environment, a flat box shaped like home plate with sufficiently beveled sides would likely cause minimal obstruction. For desktop use, the flat box containing the transmitter could be embedded into either a computer keyboard or a computer monitor. It is noted that, in some applications, a flat transmitter box may cover significantly larger area than its equivalent non-flat box. By embedding the flat transmitter box into the environment, it would more likely be viewed as a feature of rather than an obstacle in the environment.

The circuit design for a transmitter to be housed in a flat box is substantially the same as the design described above with the orthogonal transmitter coils. Two differences are the transmitter coil geometry and the shape of the box. In the flat transmitter, the transmitter coils can be placed anywhere on the x-y plane, as long as their centers are not collinear. This would provide enough information to resolve the position and orientation in half the space. Like the orthogonal transmitter coil system, there can be ambiguity regarding whether the resolved position of a remote object is in front of or behind a plane. For the flat transmitter coil system, that plane corresponds to the plane of the transmitter coils. For a flat transmitter box shaped like home plate (see FIG. 12) mounted to the floor, however, such ambiguity is not an issue. In the transmitter box shaped like home plate, the coils for the transmitter can be located at the vertices of an equilateral or isosceles triangle, as depicted, for example, in FIG. 12.

The receiver for the flat transmitter coil system has three receiver coils, but these coils are orthogonal. It is noted that the receiver hardware is substantially the same as that in systems with an orthogonal set of transmitter coils. One difference, however, is in the firmware, where the later stages of the triangulation computation are replaced with different mathematics. With appropriate firmware that detects the nature of the transmitter electromagnetic field, one receiver can be used with both flat and non-flat transmitters.

Figure 13:
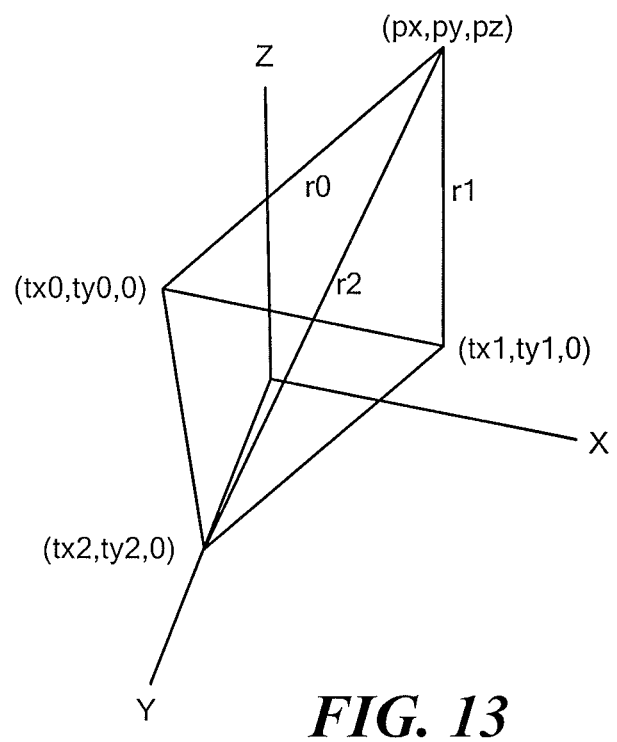
FIG. 13 is a diagram defining axes and vector notation for calculating electromagnetic fields generated by the coplanar transmitter coils of FIG. 12.

A rapidly converging iterative algorithm converts the sensed magnetic field vectors to a position. First, an initial approximation for the position of the remote object is obtained. An approximate distance to each transmitter coil is then calculated, as follows.

$$r_0 = (v_0^2 + v_1^2 + v_2^2)^{-1/3}$$

$$r_1 = (v_3^2 + v_4^2 + v_5^2)^{-1/3}$$

$$r_2 = (v_6^2 + v_7^2 + v_8^2)^{-1/3}$$

where "$v_0$", "$v_1$", and "$v_2$" are the mutual inductance values for transmitter coil 1, "$v_3$", "$v_4$", and "$v_5$" are the mutual inductance values for transmitter coil 2, etc. The position of each transmitter coil center is known. Once the distances are obtained, the problem becomes solving for the "intersection of three spheres", as follows (see also FIG. 13).

$$t_{x1} = -t_{x0}, t_{x2} = 0, t_{y0} = t_{y1}$$

$$k_0 = t_{y2} - t_{y1}$$

$$k_1 = 0.25/(t_{x1} k_0)$$

$$k_2 = k_0 k_1$$

$$k_3 = t_{x1} k_1$$

$$k_4 = 2k_3(t_{y2}^2 - t_{x1}^2 - t_{y1}^2)$$

$$p_x = k_2(r_0 - r_1)$$

$$p_y = k_3(r_0 + r_1 - 2r_2) + k_4$$

$$p_z = \mathrm{sqrt}(r_0 - (p_x - t_{x0})^2 - (p_y - t_{y1})^2)$$

The expressions for $p_x$, $p_y$, $p_z$ above define the initial approximation for the position of the remote object. It is noted that the constants $k_0$ through $k_4$ can be calculated in advance. Next, the initial approximation for the position is plugged into the mathematical coil model. For an ideal dipole, the mathematics are expressed as follows.

$$d = v_x^2 + v_y^2 + v_z^2$$

$$b_x = (3 v_x v_z)/d^{2.5}$$

$$b_y = (3 v_y v_z)/d^{2.5}$$

$$b_z = (3 v_z v_z - d^2)/d^{2.5}$$

where "V" is the vector from the transmitter to the receiver (i.e., $V = P - T_i$), "B" is the magnetic field vector at position P based on the coil model, and "z" is normal to the coil plane.

If large coils are used, then a more accurate model of the magnetic field may be required. Because this solution is iterative, it is not difficult to use a more advanced model such as one based on path integration using the Biot-Savart Law.

Next, the magnetic field vectors from all three transmitter coils are calculated. From these results, the position is once again solved using the approximation of three spheres described above. This gives two solutions for the position, as follows.

P: the initial approximation, based on the actual receiver values

P': the value after going through a forward (ideal dipole model) and inverse (the intersection of three spheres) transform The error can then be estimated, as follows.

$$D = P - P'$$

Next, the error vector is added to the initial approximation to get a second, improved approximation of the position, as follows.

$$P_2 = P + D = 2P - P'$$

To further refine this solution, the above steps can be repeated, but this time using the above improved approximation of the position in place of the "intersection of three spheres" approximation. The iteration can continue indefinitely by recursively replacing the approximation function in this way. More steps of recursion improves the solution, and usually three such iterations are sufficient.

Once the position is found, the orientation can be determined. First, a 3×3 matrix containing the magnetic field vectors from each transmitter coil at the final position estimate $P_i$ is determined. The original 3×3 matrix V of sampled inductance values is this resultant 3×3 matrix V' with an unknown orientation M applied, as follows.

$$V = V'M$$

The above expression can be solved using linear algebra. The resultant 3×3 matrix M is then refined to be orthogonal by repeatedly averaging each vector with the cross product of the other two vectors, and normalizing after each step. Eight such iterations are sufficient in most cases.

Winding Orthogonal Coils Around the Circuit Board

One constraint in designing a transmitter for a magnetic tracking system is the size of the transmitter coils. Increasing the size of the transmitter coils increases the amplitude of the magnetic field, which, in turn, increases the signal-to-noise ratio and the range. However, some applications may require a small transmitter. To fulfill these needs, the size of the transmitter coils is maximized, while assuring that the transmitter fits inside a small box.

It is also useful to reduce the number of parts in the transmitter. Mounting the clock generator 112 and the switching excitation system 106 near the transmitter coils LT1, LT2, LT3 increases the efficiency of the transmitter, as it minimizes the resistance for driving the coils. One approach is to mount the clock generator board next to the transmitter coils. There are potential problems with such an arrangement, however. First, the space inside the transmitter coils is wasted. Second, most circuit boards have a ground and power plane, and the transmitter coil magnetic fields can induce eddy currents in these planes, which reduces the efficiency of the transmitter. Finally, having large copper planes near a coil can significantly distort the magnetic field, which can complicate the calibration of the system.

Figure 14:
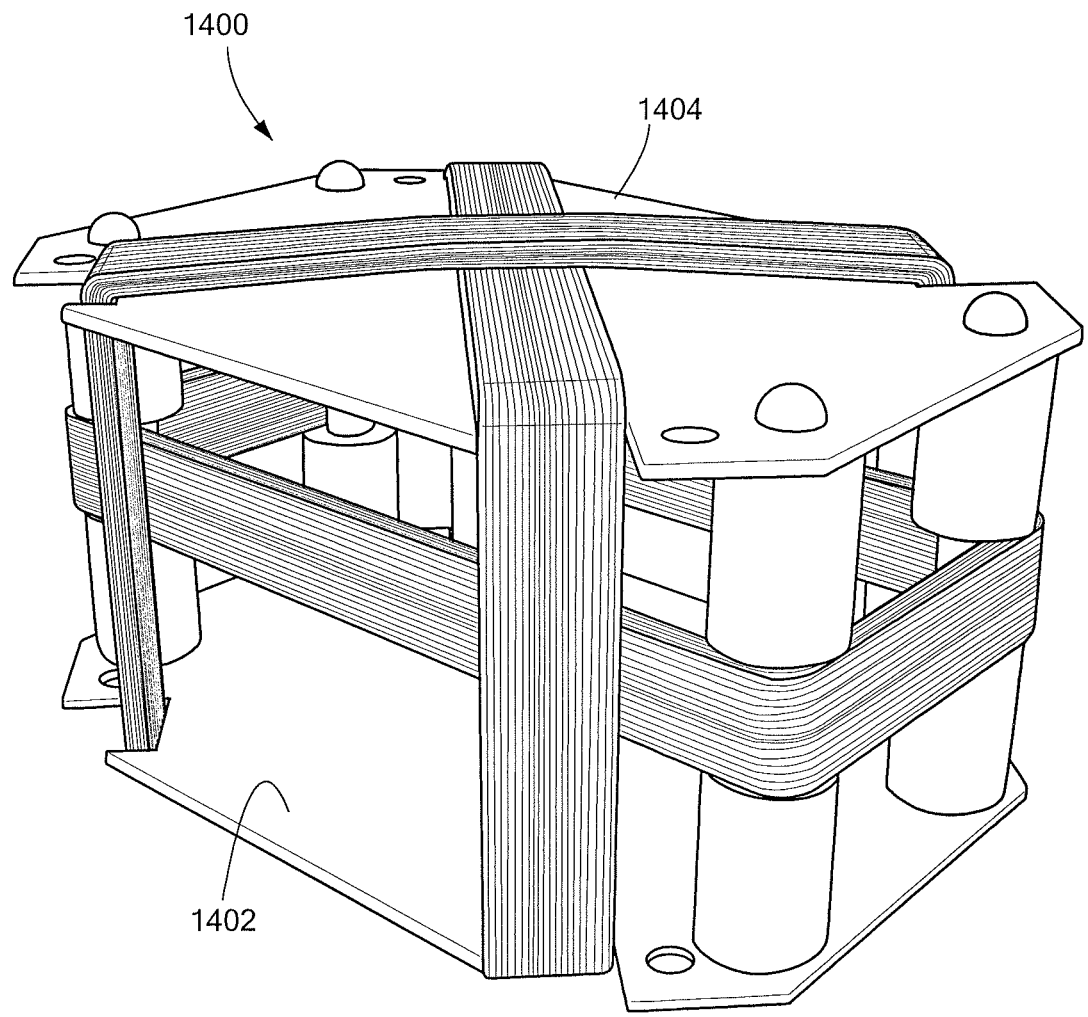
FIG. 14 is a perspective view showing an example of winding orthogonal coils around a circuit board with standoffs for placement in a rectangular case, according to another exemplary embodiment of the present application.

In one embodiment, such problems can be solved by winding the transmitter coils around the circuit board, and using ferrite material to shield the magnetic fields from the circuit board's copper. There are several techniques that can be used to wind coils around a circuit board. For example, FIG. 14 depicts an illustrative model 1400 designed for a typical rectangular transmitter box. The bottom circuit board 1402 contains most of the circuitry, while the top board 1404 may be either a second circuit board (if more space is required) or a plastic dummy plate. The boards 1402, 1404 are designed with notches in their four corners, which hold the transmitter coils. Mounting the coils at about a 45 degree angle (horizontally) increases the area of two of the coils inside the box.

It is noted that two of the transmitter coils are touching the boards 1402, 1404. Care is taken when laying out the boards to keep any components on the outer side away from the coils. To reduce the complexity of the arrangement, such components may be placed on just the inner side of the board(s).

It is further noted that having a circuit board right next to a transmitter coil can induce large eddy currents, thereby reducing the overall efficiency of the transmitter. However, by mounting ferrite plates on the back of the circuit board(s), the ferrite effectively acts as a shield between the transmitter coil and the copper of the circuit board(s).

For a transmitter in which the transmitter coils are not wound around a circuit board, ferrite can still be used as a shield. However, unlike the case of a circuit board inside a coil, it is difficult to mount a ferrite plate in a symmetric manner. It is noted that asymmetry makes calibration more difficult. By maintaining symmetry, a simpler calibration model can be employed.

For a mass-produced system, manually wound coils are labor intensive and thus expensive. One way to improve things is to use ribbon cable for the transmitter coils. Each ribbon cable can be wrapped around the circuit board with a single turn. A connector configured to allow the ends of the ribbon cable to be connected with the wires offset by 1 pin may also be employed. The two pins sticking out then become the ends of the coil.

Interlocking Orthogonal Coil Bobbins that Allow Separate Winding of Coils

Most magnetic tracking systems use sets of three orthogonal coils with a common center in the transmitter to generate the reference electromagnetic fields, and a similar set of coils in the receiver as sensors for those reference fields. A set of orthogonal coils is defined herein as a group of three coils of wire, each one being perpendicular to the other two, with all three having a common center. In some systems, these coils are generally wound on a single core using one of the following techniques:

1. cutting a plus-sign shaped groove into all six faces of a solid cube of non-conductive non-magnetic material in which to hold the wires in place;
2. starting with a hollow cylinder of similar material and cutting a groove around the middle and four small notches every 90 degrees at each of the two ends; and
3. adding tabs to a square-shaped coil bobbin with one coil already wound on it to hold the additional wires.

However, it is noted that an automated coil winding system generally cannot employ a simple axle passing through the common center of any single core design. If the plane of the second or third coil to be wound is not to wobble, then the axle would intersect one of the previously wound coils. A holder configured to hold the coil off-center may therefore be required.

Moreover, the three coils are typically wound sequentially, inside to outside. However, if an inner coil fails, such as by a wire break, then all of the coils may have to be undone and restarted from scratch. In addition, wire leads from previously wound coils are typically manually moved out of the way while winding subsequent coils, thereby increasing costs and raising reliability issues.

Figure 15:
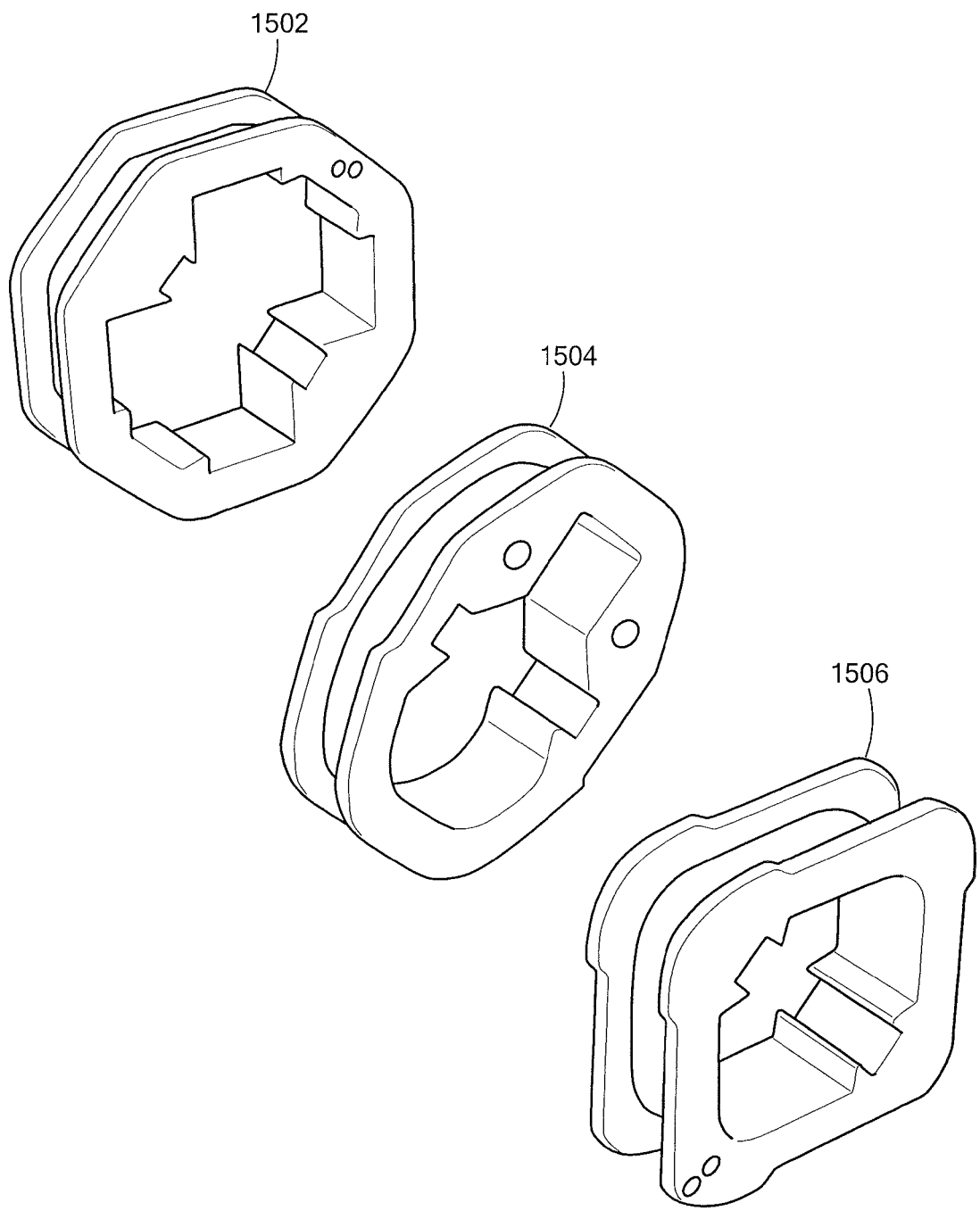
FIG. 15 is a perspective view of a configuration of three coil bobbin cores for making receiver coils that can slide together to form an orthogonal set of three coils with a common center, according to still another exemplary embodiment of the present application.

In one embodiment, the design includes one bobbin per coil, for a total of three coil bobbins 1502, 1504, 1506, as depicted in FIG. 15. The different shapes of the coil bobbins 1502, 1504, 1506 are shown in FIG. 15 for purposes of illustration. The coil bobbins 1502, 1504, 1506 are wound independently of one another. An automated coil winder (not shown) with a simple rectangular-shaped axle passing through the center of each coil bobbin may be employed to wind the coils separately. All three coil bobbins can fit the same axle. Each coil bobbin has two small holes close together for holding the ends of the coil wire in place.

Figure 16A:
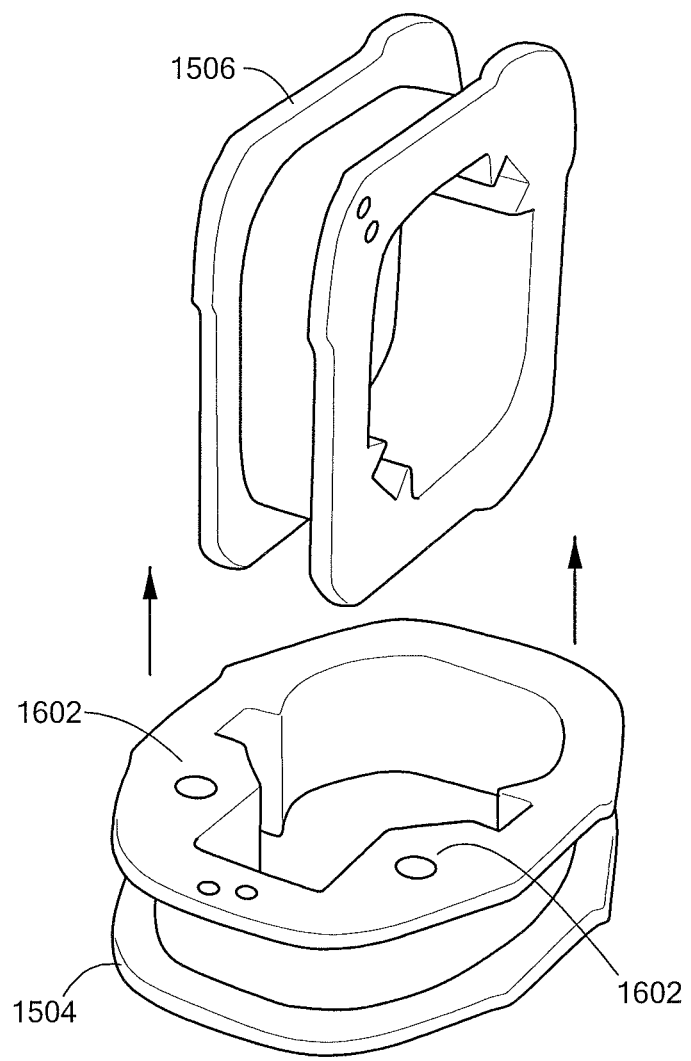
FIGS. 16a-16c are perspective views of steps illustrating the sliding together of the three coil bobbins of FIG. 15.
Figure 16B:
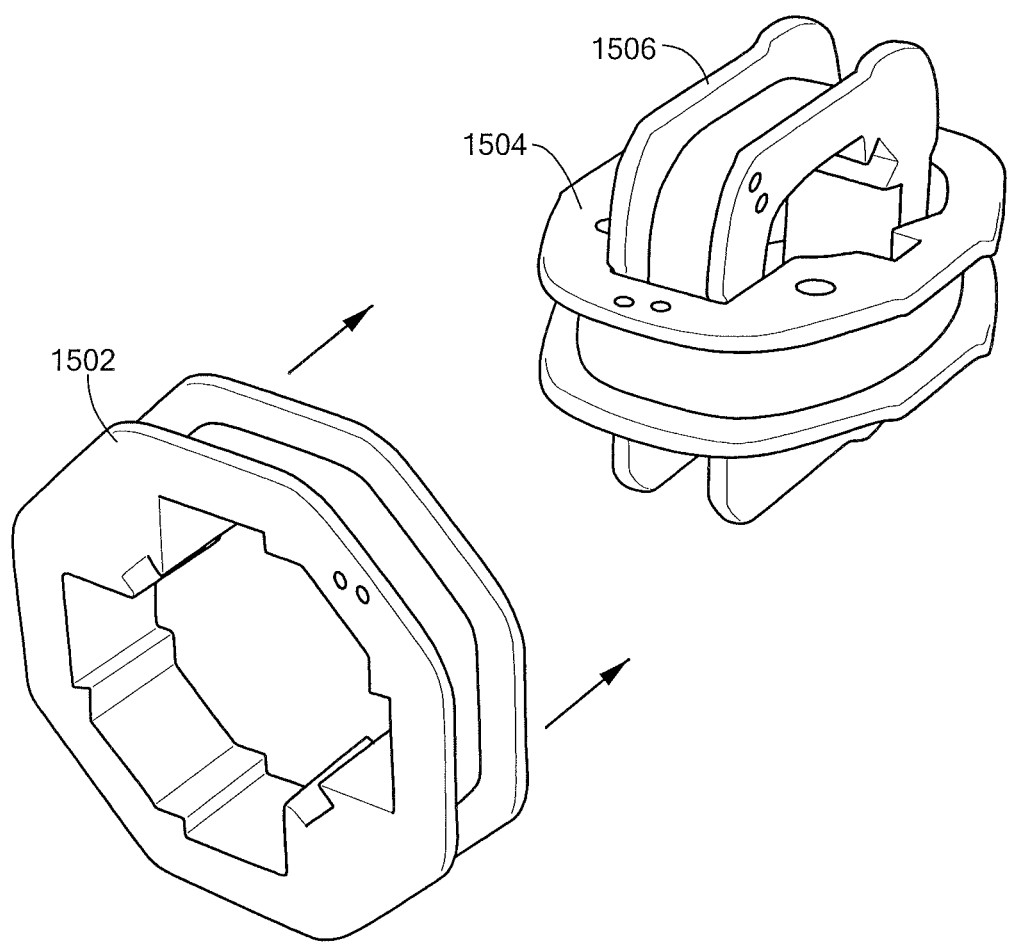
Figure 16C:
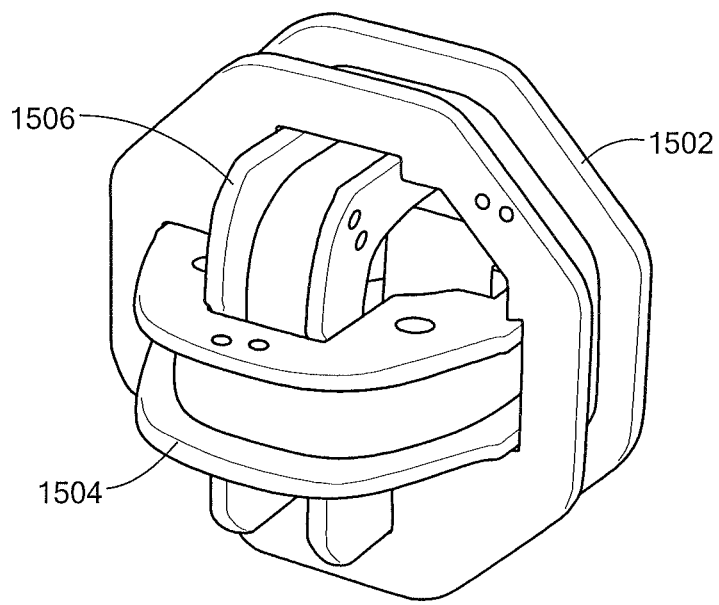
Figure 17:
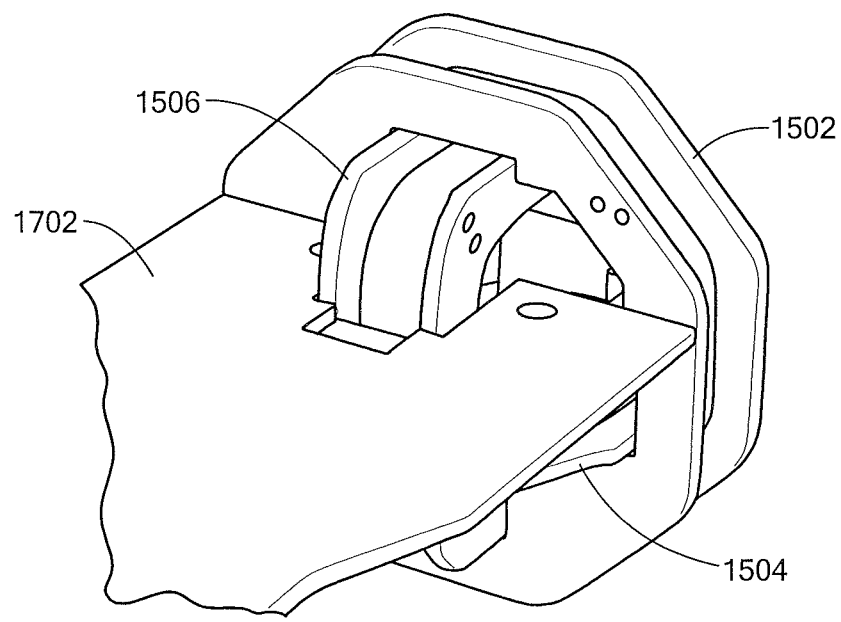
FIG. 17 is a perspective view of a configuration of the three coil bobbin cores of FIG. 15 coupled to a planar material such as a circuit board.

Once the coils are wound, the coil bobbins 1502, 1504, 1506 can be mounted orthogonal to one another by sliding the pieces together, as depicted in FIGS. 16a-16c. The inner and middle coil bobbins 1506, 1504 have grooves configured to stop their outer counterparts in the center. The middle coil bobbin 1504 has two holes 1602 for mounting the bobbins 1502, 1504, 1506 and the coils wound thereon to any convenient planar material or structure 1702 (see FIG. 17) with plastic screws or any other suitable fasteners. In one embodiment, this planar material 1702 corresponds to the circuit board that includes the circuitry to which the coils are connected. The circuit board or other planar material 1702 holds the three coil bobbins together, as depicted in FIG. 17.

It will be appreciated by those of ordinary skill in the art that modifications to and variations of the above-described electromagnetic position and orientation sensing system may be made without departing from the inventive concepts disclosed herein. Accordingly, the invention should not be viewed as limited except as by the scope and spirit of the appended claims.

What is claimed is:

1. A method of sensing a position and an orientation of a remote object, for use in a system comprising a transmitter having a plurality of transmitter coils and at least one receiver having a plurality of receiver coils, the receiver being associated with the remote object, the plurality of transmitter coils for generating a plurality of electromagnetic fields in response to a plurality of excitation currents, respectively, thereby inducing a corresponding plurality of receiver voltages in each of the plurality of receiver coils, the plurality of excitation currents and the plurality of receiver voltages being substantially sinusoidal, the plurality of electromagnetic fields defining a reference coordinate system for the sensing of the position and the orientation of the remote object, the method comprising the steps of:

detecting, within a sampling window, the plurality of receiver voltages induced in each receiver coil by the plurality of excitation currents, the sampling window having a start and a duration, calculating a time shift between a common zero crossing of the plurality of receiver voltages and the start of the sampling window;

converting each of the plurality of receiver voltages induced in each receiver coil into a set of digital samples, and, for each set of digital samples, calculating an inner product of the respective set of digital samples and a predetermined set of basis functions, thereby obtaining sine and cosine component amplitudes for each receiver voltage at each receiver coil; and using the sine and cosine component amplitudes for each receiver voltage and taking into account the time shift, calculating a real phasor component for each receiver voltage induced in each receiver coil, each real phasor component having an amplitude and a sign at least partially indicative of the position and the orientation, respectively, of the remote object within the reference coordinate system.

2. The method of claim 1 further including:

deriving excitation frequencies for the respective excitation currents from a transmitter clock associated with the transmitter; and deriving a sampling frequency for the receiver voltages induced in each receiver coil from a receiver clock associated with the receiver, the receiver clock being unsynchronized with the transmitter clock, wherein the duration of the sampling window corresponds to an integer number of cycles of the sampling frequency, wherein the plurality of excitation currents are periodic within the duration of the sampling window, and wherein the duration of the sampling window represents a minimum time resolution for the sensing of the position and the orientation of the remote object.

3. The method of claim 1 further including:

deriving excitation frequencies for the respective excitation currents from a transmitter clock associated with the transmitter; and deriving a sampling frequency for the receiver voltages induced in each receiver coil from a receiver clock associated with the receiver, the receiver clock being unsynchronized with the transmitter clock, wherein the excitation frequencies correspond to different integer sub-multiples of a predetermined master clock frequency, the excitation frequencies having values that are in integer ratios to each other, and wherein the sampling frequency corresponds to an integer sub-multiple of the predetermined master clock frequency.

4. The method of claim 1 wherein the calculating of the time shift includes calculating the time shift between the common zero crossing of the plurality of receiver voltages and the start of the sampling window at a time when the plurality of receiver voltages transition from negative to positive.

* * * * *